(12) United States Patent
Miyairi et al.

(10) Patent No.: US 12,272,773 B2
(45) Date of Patent: Apr. 8, 2025

(54) LIGHT EMITTING DEVICE AND METHOD OF MANUFACTURING LIGHT EMITTING DEVICE

(71) Applicant: Nichia Corporation, Anan (JP)

(72) Inventors: Hiroshi Miyairi, Yokohama (JP); Yoshimi Katsumoto, Ota-ku (JP); Takayuki Igarashi, Yokohama (JP); Yoshifumi Hodono, Yokohama (JP); Shinya Endo, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/511,451

(22) Filed: Nov. 16, 2023

(65) Prior Publication Data

US 2024/0088332 A1 Mar. 14, 2024

Related U.S. Application Data

(62) Division of application No. 17/154,464, filed on Jan. 21, 2021, now Pat. No. 11,862,760.

(30) Foreign Application Priority Data

Feb. 20, 2020 (JP) .................................. 2020-027238

(51) Int. Cl.
*H01L 33/50* (2010.01)
*H01L 25/075* (2006.01)
(Continued)

(52) U.S. Cl.
CPC .......... *H01L 33/505* (2013.01); *H01L 33/507* (2013.01); *H01L 33/54* (2013.01);
(Continued)

(58) Field of Classification Search
CPC .. H01L 33/54; H01L 33/60; H01L 2933/0058
See application file for complete search history.

(56) References Cited

U.S. PATENT DOCUMENTS

2009/0086449 A1 4/2009 Minamio et al.
2014/0069568 A1* 3/2014 Mohapatra ............. B65H 20/02
156/64
(Continued)

FOREIGN PATENT DOCUMENTS

JP 2007-088235 A 4/2007
JP 2009-081346 A 4/2009
(Continued)

*Primary Examiner* — Antonio B Crite
(74) *Attorney, Agent, or Firm* — SQUIRE PATTON BOGGS (US) LLP

(57) ABSTRACT

A light emitting device includes: a substrate; a light emitting element; a wavelength conversion layer; and a wall surrounding the wavelength conversion layer, having an opening portion exposing at least a part of a top surface of the wavelength conversion layer, and containing a light reflective material. The surface of the wall includes a top surface provided at a higher position than the top surface of the wavelength conversion layer, and an inner surface forming the opening portion. The wall includes a first portion surrounding the wavelength conversion layer, and a second portion provided over the first portion and surrounding the first portion. The opening portion is hollow. An angle of a corner portion between the top surface and the inner surface of the wall is in a range of 90 degrees or greater and less than 180 degrees.

19 Claims, 17 Drawing Sheets

(51) Int. Cl.
*H01L 33/54* (2010.01)
*H01L 33/60* (2010.01)
*H01L 33/62* (2010.01)

(52) U.S. Cl.
CPC ...... *H01L 33/60* (2013.01); *H01L 2933/0041* (2013.01); *H01L 2933/005* (2013.01); *H01L 2933/0058* (2013.01)

(56) References Cited

U.S. PATENT DOCUMENTS

| | | |
|---|---|---|
| 2015/0263239 A1 | 9/2015 | Watanabe |
| 2018/0122993 A1 | 5/2018 | Camras |
| 2019/0088829 A1 | 3/2019 | Takei et al. |
| 2019/0189871 A1* | 6/2019 | Nagel ............... H01L 33/58 |
| 2019/0267519 A1* | 8/2019 | Nagel ............... H01L 33/50 |
| 2020/0182424 A1 | 6/2020 | Yuge et al. |

FOREIGN PATENT DOCUMENTS

| | | |
|---|---|---|
| JP | 2010-157638 A | 7/2010 |
| JP | 2010-283281 A | 12/2010 |
| JP | 2013-247067 A | 12/2013 |
| JP | 2014-072213 A | 4/2014 |
| JP | 2015-076456 A | 4/2015 |
| JP | 2015-084384 A | 4/2015 |
| JP | 2015-177005 A | 10/2015 |
| JP | 2016-122690 A | 7/2016 |
| JP | 2018-195758 A | 12/2018 |
| JP | 2019-057655 A | 4/2019 |
| JP | 2019-204812 A | 11/2019 |
| WO | 2019/064980 A1 | 4/2019 |

* cited by examiner

LIGHT EMITTING DEVICE AND METHOD OF MANUFACTURING LIGHT EMITTING DEVICE

CROSS-REFERENCE TO RELATED APPLICATION

This is a divisional application of U.S. patent application Ser. No. 17/154,464, filed Jan. 21, 2021, which application claims priority to Japanese Patent Application No. 2020-027238, filed on Feb. 20, 2020, the disclosure of which is hereby incorporated by reference in its entirety.

BACKGROUND

The present disclosure relates to a light emitting device and a method of manufacturing the light emitting device.

Conventionally, there is known a light emitting device including a substrate, a light emitting element provided on the substrate, a wavelength conversion layer provided on the light emitting element, and a wall that contains a light reflective material and surrounds the wavelength conversion layer. In such a light emitting device, there is a demand to suppress an disadvantage in which light propagates into the wall and the light propagating into the wall leaks from a top surface of the wall (See, for example, Japanese Patent Publication No. 2018-195758).

SUMMARY

An object of certain embodiments is to provide a light emitting device that can suppress light leakage from a top surface of a wall, and a method of manufacturing the light emitting device.

A light emitting device according to an embodiment includes a substrate, a light emitting element that is provided on the substrate and emits first light, a wavelength conversion layer that is provided on the light emitting element and converts a wavelength of a part of the first light to emit second light, and a wall that contains a light reflective material, surrounds the wavelength conversion layer, and is provided with an opening portion exposing at least a part of a top surface of the wavelength conversion layer. In the light emitting device, a surface of the wall includes a top surface provided at a higher position than the top surface of the wavelength conversion layer, and an inner surface forming the opening portion. The wall includes a first portion surrounding the wavelength conversion layer, and a second portion provided over the first portion and surrounding the first portion. The opening portion is hollow. An angle of a corner portion between the top surface and the inner surface of the wall is in a range of 90 degrees or greater and less than 180 degrees.

A method of manufacturing a light emitting device according to an embodiment includes disposing a light emitting element on a substrate, disposing a wavelength conversion layer on the light emitting element, placing a mold member on the wavelength conversion layer, providing a light reflecting material that is uncured so as to surround the wavelength conversion layer and the mold member such that a top surface of the light reflecting material after being cured protrudes toward a direction from the substrate to the top surface of the light reflecting material or is parallel to a top surface of the substrate, forming a wall by curing the light reflecting material, and removing the mold member to form a hollow opening portion in the wall, the hollow opening portion exposing at least a part of a top surface of the wavelength conversion layer.

According to certain embodiments, a light emitting device may be provided in which the occurrence of light leakage from a top surface of a wall can be suppressed, and a method of manufacturing the light emitting device.

DETAILED DESCRIPTION

A light emitting device according to an embodiment includes: a substrate; a light emitting element that is provided on the substrate and emits first light; a wavelength conversion layer that is provided on the light emitting element and converts a wavelength of a part of the first light to emit second light; and a wall that includes a light reflective material, surrounds the wavelength conversion layer, and is provided with an opening portion exposing at least a part of a top surface of the wavelength conversion layer. In the light emitting device, a surface of the wall includes a top surface provided at a higher position than the top surface of the wavelength conversion layer, and an inner surface forming the opening portion. The wall includes a first portion surrounding the wavelength conversion layer, and a second portion provided over the first portion and surrounding the first portion. The opening portion is hollow. An angle of a corner portion between the top surface and the inner surface of the wall is in a range of 90 degrees or greater and less than 180 degrees.

A method of manufacturing a light emitting device according to an embodiment includes: disposing a light emitting element on a substrate; disposing a wavelength conversion layer on the light emitting element; placing a mold member on the wavelength conversion layer; providing a light reflecting material that is uncured so as to surround the wavelength conversion layer and the mold member such that a top surface of the light reflecting material after being cured protrudes toward a direction from the substrate to the top surface of the light reflecting material or is parallel to a top surface of the substrate; forming a wall by curing the light reflecting material, and removing the mold member to form a hollow opening portion in the wall, the hollow opening portion exposing at least a part of a top surface of the wavelength conversion layer.

Figure 1:
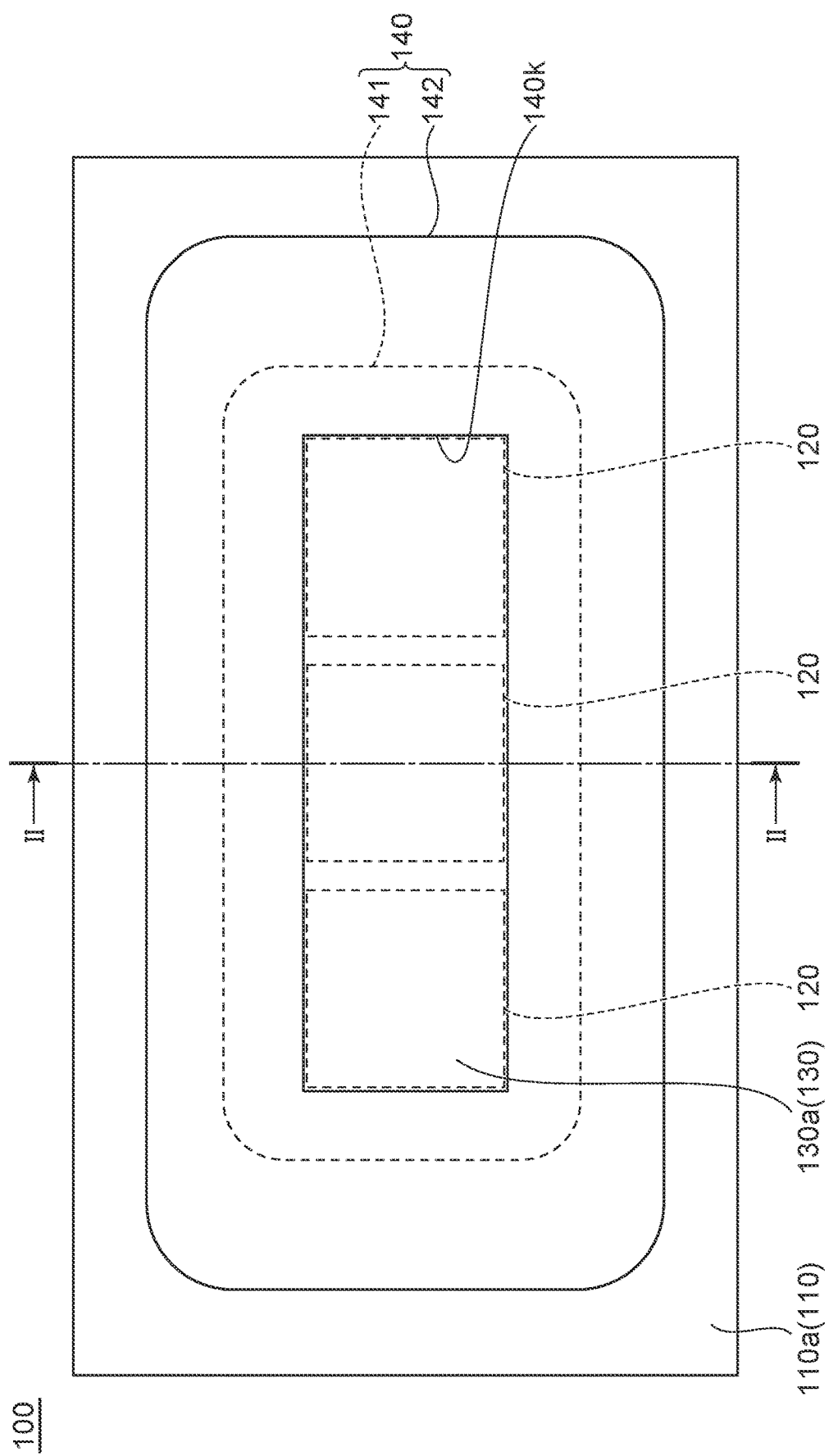
FIG. 1 is a schematic top view illustrating a light emitting device according to a first embodiment.
Figure 2:
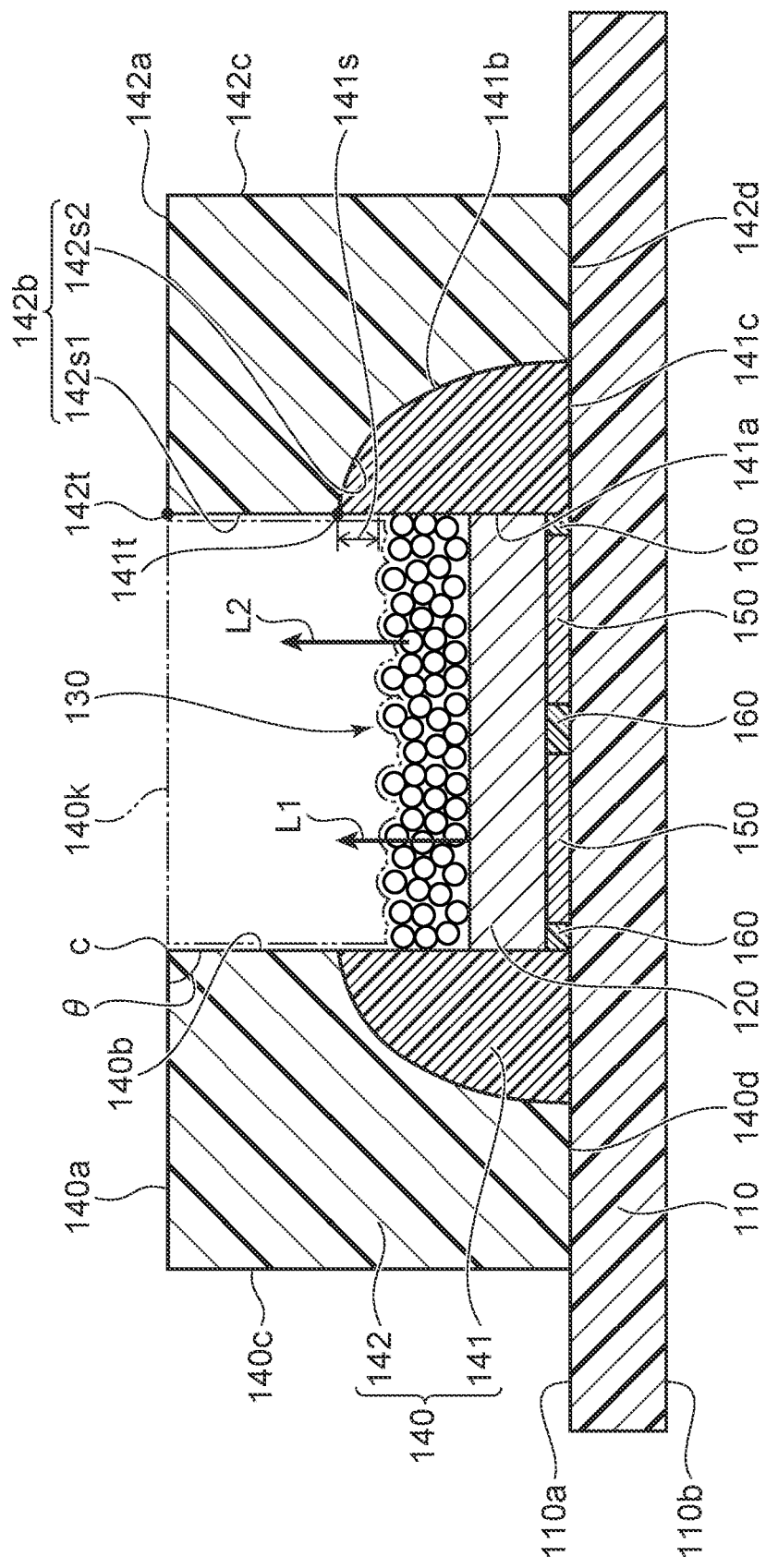
FIG. 2 is a schematic end view taken along line II-II in FIG. 1.

Next, a specific configuration of a light emitting device according to certain embodiments will be described. Hereinafter, in the present specification, an XYZ Cartesian coordinate system is employed for convenience of description. As illustrated in FIGS. 1 and 2, a direction from a substrate 110 toward a light emitting element 120 is referred to as a "Z direction". The Z direction is also referred to as an "upward direction". A direction opposite to the Z direction is also referred to as a "downward direction". One direction orthogonal to the Z direction is referred to as an "X direction". A direction orthogonal to the Z direction and the X direction is referred to as a "Y direction". Furthermore, a direction orthogonal to the Z direction, such as the X direction and the Y direction, is also referred to as a "lateral direction".

First Embodiment

First, a light emitting device 100 according to a first embodiment will be described.

FIG. 1 is a schematic top view illustrating the light emitting device 100 according to the present embodiment.

FIG. 2 is a schematic end view taken along line II-II in FIG. 1.

As illustrated in FIGS. 1 and 2, the light emitting device 100 includes the substrate 110, the light emitting element 120, a wavelength conversion layer 130, and a wall 140.

As illustrated in FIG. 2, the light emitting element 120 is provided on the substrate 110 and emits a first light L1. The wavelength conversion layer 130 is provided on the light emitting element 120 and converts a wavelength of a part of the first light L1 to emit a second light L2. The wall 140 contains a light reflective material. The wall 140 surrounds the wavelength conversion layer 130 and forms an opening portion 140k exposing at least a part of a top surface 130a of the wavelength conversion layer 130.

The surface of the wall 140 includes a top surface 140a provided at a higher position than the top surface 130a of the wavelength conversion layer 130, and an inner surface 140b that forms the opening portion 140k. The wall 140 includes a first portion 141 surrounding the wavelength conversion layer 130, and a second portion 142 provided over the first portion 141 and around the first portion 141. The opening portion 140k is hollow. The "opening portion 140k" refers to a portion located above the top surface 130a of the wavelength conversion layer 130 and surrounded by the inner surface 140b. An angle θ of a corner portion c defined by the top surface 140a and the inner surface 140b of the wall 140 is in a range of 90 degrees or greater and less than 180 degrees. Each component of the light emitting device 100 will be described in detail below.

The substrate 110 is, for example, a wiring substrate in which wiring for the light emitting element 120 is disposed in a base material formed from a resin material. However, the base material of the substrate 110 is not limited thereto, and ceramics or the like can be used.

The surface of the substrate 110 includes a top surface 110a and a bottom surface 110b, as illustrated in FIG. 2. The top surface 110a and the bottom surface 110b are flat surfaces and are substantially parallel in the X direction and the Y direction. As illustrated in FIG. 1, the shape of the substrate 110 in a top view is rectangular. However, the shape of the substrate 110 in top view is not limited thereto.

Three of the light emitting elements 120 are mounted on the top surface 110a of the substrate 110. The three light emitting elements 120 are arranged along the X direction. However, the number of the light emitting elements 120 provided on the substrate 110 is not particularly limited as long as the number is one or more. If a plurality of the light emitting elements 120 are provided in the light emitting device 100, the plurality of light emitting elements 120 can be arranged not only in the X direction, but also in the Y direction. The shape of each of the light emitting elements 120 in a top view is quadrangular. However, the shape of the light emitting element 120 is not limited thereto.

As illustrated in FIG. 2, in the present embodiment, the light emitting element 120 is a light emitting diode (LED) in which a front surface side of a semiconductor layer on a growth substrate of the light emitting element 120 is mounted on the substrate 110 by face-down mounting. A conductive joint member 150 is provided between each of the light emitting elements 120 and the substrate 110. Each of the light emitting elements 120 is joined to the substrate 110 by using the joint member 150.

The light emitting element 120 emits blue light as the first light L1. However, the color of the first light L1 is not limited to blue.

A light shielding layer 160 is provided between each of the light emitting elements 120 and the substrate 110. The light shielding layer 160 includes a base material formed of a resin material, and a plurality of fillers dispersed in the base material. A thermosetting resin such as a silicone resin or an epoxy resin can be used as the resin material. A light reflective material such as titanium oxide ($TiO_2$) can be used as the filler. However, the light shielding layer 160 need not necessarily be provided between each of the light emitting elements 120 and the substrate 110.

Figure 3:
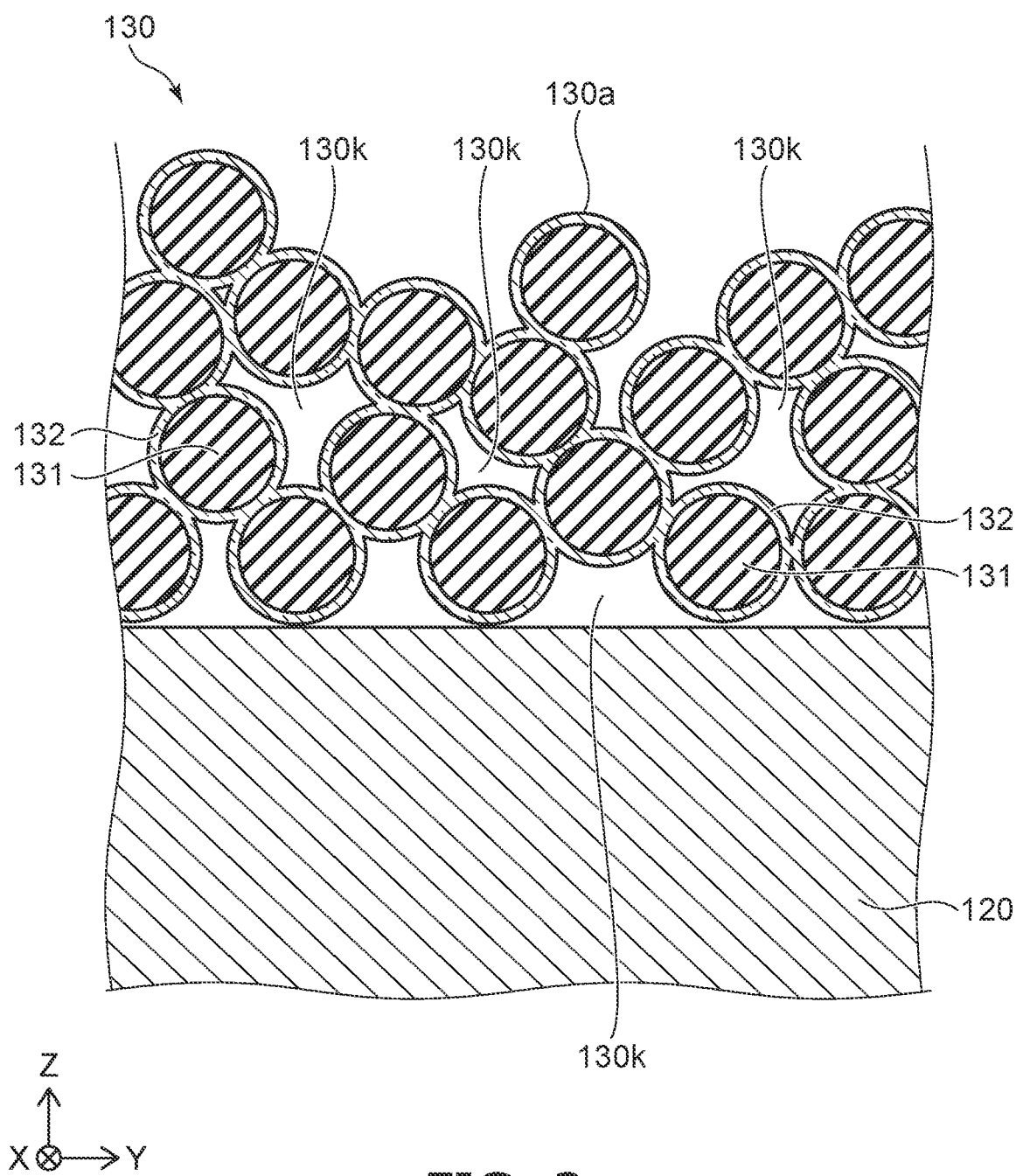
FIG. 3 is an enlarged schematic end view illustrating a part of a light emitting element and a part of a wavelength conversion layer illustrated in FIG. 2.

FIG. 3 is an enlarged schematic end view illustrating a part of the light emitting element and a part of the wavelength conversion layer illustrated in FIG. 2.

The wavelength conversion layer 130 is provided on the top surface of each of the light emitting elements 120. The wavelength conversion layer 130 contains a plurality of wavelength conversion particles 131. The top surface 130a of the wavelength conversion layer 130 has protrusions and recesses resulting from the plurality of wavelength conversion particles 131.

A yellow phosphor that absorbs the blue first light L1 and emits the yellow second light L2 can be used for the wavelength conversion particles 131. The wavelength conversion layer 130 emits the second light L2 and transmits a part of the first light L1. Therefore, the light emitting device 100 emits white light in which the first light L1 and the second light L2 are mixed.

However, the wavelength conversion particles 131 are not limited to the yellow phosphor. A red phosphor that converts the wavelength of the first light L1 to emit red light, or a green phosphor that converts the wavelength of the first light L1 to emit green light can be used as the wavelength conversion particles 131. In this case, the light emitting device 100 can emit white light by mixing the red color of the light emitted by the red phosphor, the green color of the light emitted by the green phosphor, and the blue color of the first light L1. The light emitting device 100 can also emit single color light other than white light.

Each of the wavelength conversion particles 131 is covered by a glass layer 132. The glass layer 132 is formed of silica ($SiO_2$). The glass layer 132 holds the wavelength conversion particles 131 in the wavelength conversion layer 130 by allowing the wavelength conversion particles 131 to be bonded to each other and allowing the light emitting element 120 and the wavelength conversion particles 131 to be bonded to each other. The glass layer 132 protects the wavelength conversion particles 131 from moisture in the air and other substances. An air layer 130k (a gap) is formed between the wavelength conversion particles 131 and between the light emitting element 120 and the wavelength conversion particles 131.

Next, an example of the dimensions of each of the components will be described.

The thickness of the wavelength conversion layer 130 is in a range from 20 μm to 200 μm, for example. The diameter of each of the wavelength conversion particles 131 is, for example, in a range from 2 μm to 23 μm, or in a range from 5 to 15 μm. The thickness of the glass layer 132 is in a range from 1 μm to 5 μm, for example.

The configuration of the wavelength conversion layer 130 is not limited to the configuration described above. For example, each of the wavelength conversion particles 131 needs not necessarily be covered by the glass layer 132. In this case, the wavelength conversion particles 131 can be held in the wavelength conversion layer 130 by using a binder formed of a resin material such as silicone resin to bond the wavelength conversion particles 131 to each other and bond the light emitting element 120 and the wavelength conversion particles 131. The wavelength conversion particles 131 can be held in the wavelength conversion layer 130 by adhering the wavelength conversion particles 131 to each other and adhering the light emitting element 120 and the wavelength conversion particles 131 through electrostatic adhesion, without using a binder, for example. The top surface 130a of the wavelength conversion layer 130 can be a flat surface. For example, the wavelength conversion layer 130 can be formed of a light transmissive plate in which the plurality of wavelength conversion particles 131 are dispersed.

As illustrated in FIG. 1, the wavelength conversion layer 130 is surrounded by the wall 140. The wall 140 has a tubular shape. That is, the wall 140 forms the opening portion 140k exposing at least a part of the top surface 130a of the wavelength conversion layer 130.

The wall 140 includes the first portion 141 and the second portion 142, as illustrated in FIG. 2. Each of the first portion 141 and the second portion 142 includes a base material formed of a resin material, and a plurality of particles of filler formed of a light reflective material. A thermosetting resin such as a silicone resin or an epoxy resin can be used as the resin material of the wall 140. Silicon oxide ($SiO_2$), titanium oxide ($TiO_2$), aluminum (Al), silver (Ag), or the like can be used as the light reflective material of the wall 140.

The density of the filler in the first portion 141 and the density of the filler in the second portion 142 are different from each other. The "density of the filler" means the mass of the filler contained in the unit volume of each of the first and second portions 141 and 142.

In the present embodiment, the first portion 141 surrounds both the light emitting element 120 and the wavelength conversion layer 130. The surface of the first portion 141 includes an inner surface 141a, an outer surface 141b, and a bottom surface 141c.

The inner surface 141a surrounds the light emitting element 120 and the wavelength conversion layer 130, and is in contact with a lateral surface of the light emitting element 120 and an end portion of the wavelength conversion layer 130 in the lateral direction. An upper end 141t located at the uppermost position in the inner surface 141a is located at a position higher than the top surface 130a of the wavelength conversion layer 130. A first region 141s located between the upper end 141t and the top surface 130a of the wavelength conversion layer 130 in the inner surface 141a is perpendicular to the top surface 110a of the substrate 110. The term "perpendicular" can include variations in the manufacturing process and can mean not only "exactly perpendicular" but also "substantially perpendicular".

The outer surface 141b surrounds the inner surface 141a and is in contact with the inner surface 141a and the bottom surface 141c. The outer surface 141b extends so as to become farther from the inner surface 141a as advancing in a downward direction. However, a top surface of the first portion 141 can be located between the inner surface 141a and the outer surface 141b. In this case, the outer surface 141b can be perpendicular to the top surface 110a of the substrate 110. The bottom surface 141c is in contact with the top surface 110a of the substrate 110.

The second portion 142 is provided over the first portion 141 and surrounds the first portion 141. The density of the filler contained in the first portion 141 is higher than the density of the filler contained in the second portion 142. Thus, the light reflectance of the first portion 141 is higher than the light reflectance of the second portion 142.

The surface of the second portion 142 includes a top surface 142a, an inner surface 142b, an outer surface 142c, and a bottom surface 142d. In the present embodiment, the top surface 142a is a flat surface parallel to the top surface 110a of the substrate 110. The term "parallel" can include variations in the manufacturing process and can mean not only "exactly parallel" but also "substantially parallel".

An upper end 142t located at the uppermost position in the inner surface 142b is located above the upper end 141t of the first portion 141. The inner surface 142b includes a second region 142s1 located between the upper end 141t and the upper end 142t, and a third region 142s2 located between the upper end 141t and the bottom surface 142d. The second region 142s1 is in contact with the top surface 142a. The second region 142s1 is perpendicular to the top surface 110a of the substrate 110. The second region 142s1 is flush with the first region 141s of the first portion 141. The third region 142s2 is in contact with the outer surface 141b of the first portion 141.

The outer surface 142c surrounds the top surface 142a and is in contact with the top surface 142a and the bottom surface 142d. The outer surface 142c is perpendicular to the top surface 110a of the substrate 110. However, the outer surface 142c can be inclined with respect to the top surface 110a of the substrate 110. The bottom surface 142d is in contact with the top surface 110a of the substrate 110.

Thus, the top surface 140a of the entire wall 140 includes the top surface 142a of the second portion 142. The inner surface 140b of the entire wall 140 includes the inner surface 141a of the first portion 141 and the second region 142s1 of the second portion 142. An outer surface 140c of the entire wall 140 includes the outer surface 142c of the second portion 142. A bottom surface 140d of the entire wall 140 includes the bottom surface 141c of the first portion 141 and the bottom surface 142d of the second portion 142.

Thus, the top surface 140a is located above the top surface 130a of the wavelength conversion layer 130. The distance between the top surface 130a of the wavelength conversion layer 130 and the top surface 140a of the wall 140 is preferably in a range from 50 µm to 2000 µm. "The distance between the top surface 130a of the wavelength conversion layer 130 and the top surface 140a of the wall 140" refers to the shortest distance in the Z direction between the top surface 130a of the wavelength conversion layer 130 and the top surface 140a of the wall 140.

The angle θ of the corner portion c between the top surface 140a and the inner surface 140b is in a range of 90 degrees or greater and less than 180 degrees. In particular, in the present embodiment, the top surface 140a is parallel to the top surface 110a of the substrate 110, and a region (e.g., the second region 142s1) of the inner surface 140b that includes the upper end 142t is perpendicular to the top surface 110a of the substrate 110. Thus, the angle θ is 90 degrees.

Next, operation of the light emitting device 100 according to the present embodiment will be described.

Figure 4A:
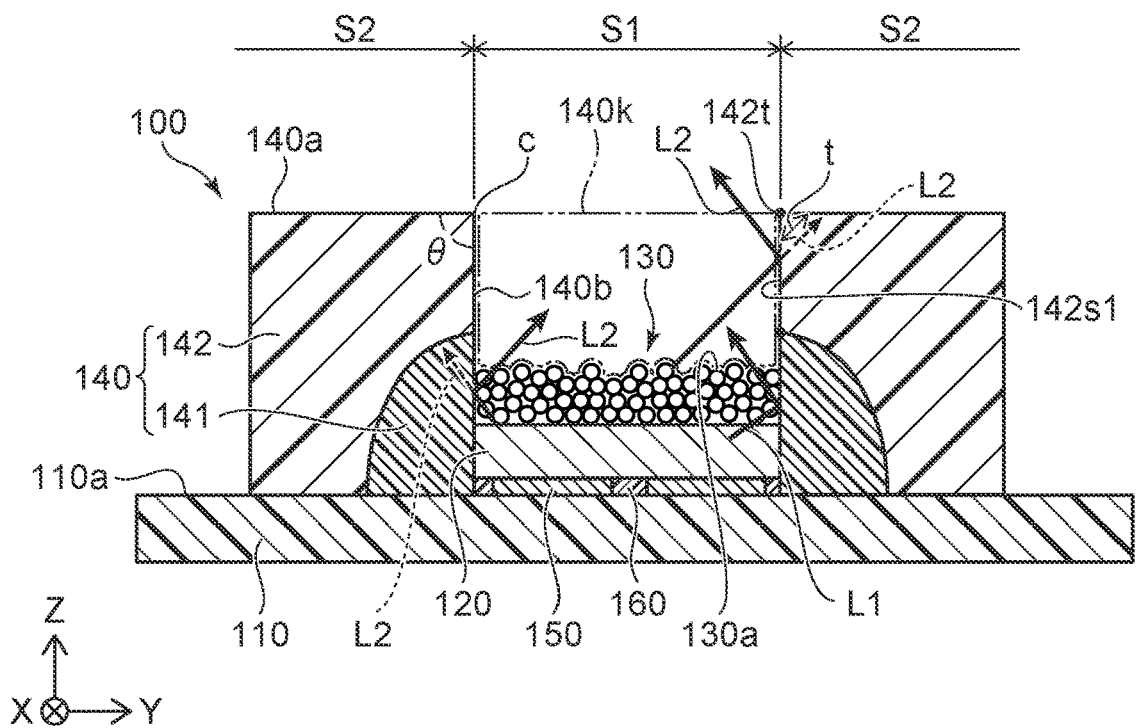
FIG. 4A is a schematic end view illustrating an example of a path of light at an end surface taken along the line II-II of FIG. 1.

FIG. 4A is a schematic diagram illustrating an example of a path of light at an end surface taken along the line II-II of FIG. 1.

Figure 4B:
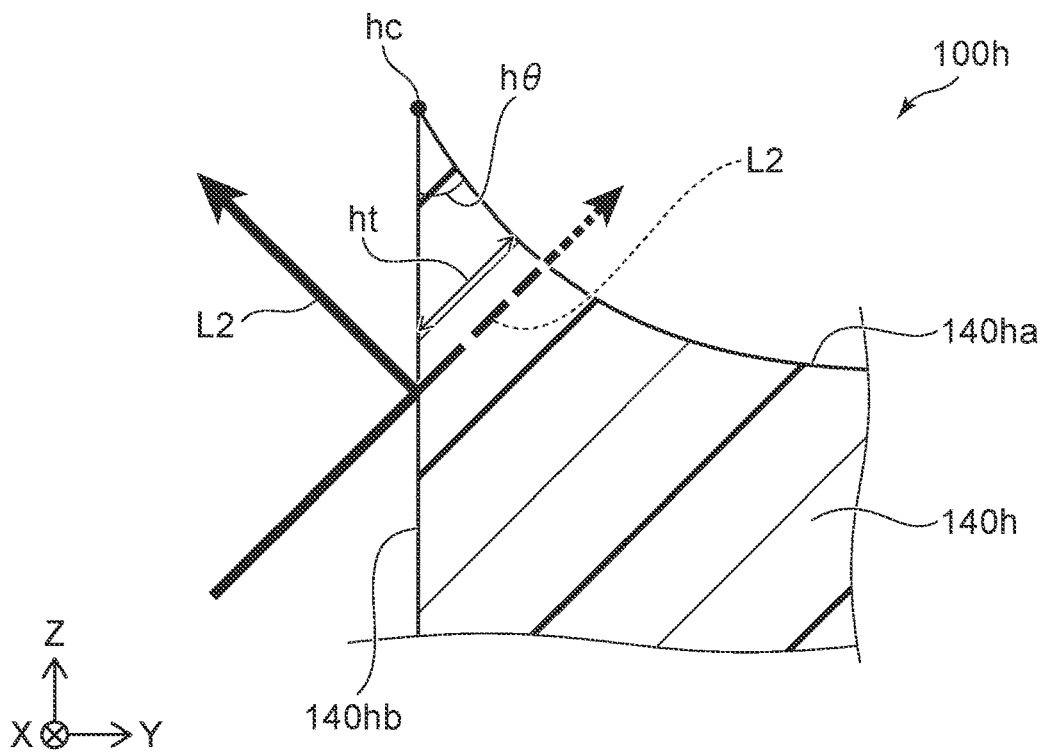
FIG. 4B is an enlarged schematic end view illustrating an example of a path of light at a corner portion of a light emitting device according to a reference example.

FIG. 4B is an enlarged schematic end view illustrating an example of a path of light at a corner portion hc of a light emitting device 100h according to a reference example.

The wall 140 surrounds the light emitting element 120 and the wavelength conversion layer 130. Thus, when the light emitting element 120 is illuminated, a portion of the first light L1 emitted from the light emitting element 120 and a portion of the second light L2 emitted from the wavelength conversion layer 130 are reflected by the wall 140.

In particular, on the inner surface 140b of the wall 140, the luminance of the incident second light L2 is higher in a region closer to a region adjacent to the wavelength conversion layer 130. Thus, the second light L2 easily propagates in a portion of the wall 140 adjacent to the wavelength conversion layer 130. In the present embodiment, the reflectance of the first portion 141 adjacent to the wavelength conversion layer 130 is higher than the reflectance of the second portion 142. Therefore, as illustrated in FIG. 4A, the second light L2 can be suppressed from propagating into the first portion 141 adjacent to the wavelength conversion layer 130.

Further, in the present embodiment, the top surface 140a of the wall 140 is located above the top surface 130a of the wavelength conversion layer 130. Thus, even if the second light L2 propagates in the first portion 141, the propagated second light L2 is attenuated in the wall 140, and emission of the second light L2 from the top surface 140a of the wall 140 can be suppressed. As a result, the second light L2 propagating in the wall 140 can be suppressed from leaking from the top surface 140a of the wall 140.

Further, in the present embodiment, the angle θ of the corner portion c is in the range from 90 degrees or greater to less than 180 degrees. Thus, a thickness t of the corner portion c (the distance between the top surface 140a and the inner surface 140b in the vicinity of the corner portion c) can be increased. As a result, even if the second light L2 propagates into the wall 140 from a region of the inner surface 140b of the wall 140 near the corner portion c, the propagated second light L2 is attenuated in the wall 140, and the second light L2 can be suppressed from leaking from the top surface 140a. On the other hand, as in the light emitting device 100h according to the reference example, if an angle 110 of the corner portion hc between a top surface 140ha and an inner surface 140hb of a wall 140h is less than 90 degrees, a thickness ht of the corner portion hc is small. Thus, if the second light L2 propagates into the wall 140h from a region of the inner surface 140hb of the wall 140h near the corner portion hc, the propagated second light L2 leaks more easily from the top surface 140ha compared to the present embodiment.

Accordingly suppression of light leakage from the top surface 140a of the wall 140 can suppress that a peripheral region S2 surrounding a region S1 directly above the light emitting element 120 and the wavelength conversion layer 130 becomes brighter. Thus, the contrast between the peripheral region S2 and the region S1 directly above the light emitting element 120 and the wavelength conversion layer 130 can be increased.

Further, in the present embodiment, a region (the second region 142s1) of the wall 140 including the upper end 142t is perpendicular to the top surface 110a of the substrate 110. Therefore, the light distribution angle can be a narrow angle, and thus, the luminance of the light emitting device 100 can be enhanced.

The opening portion 140k is hollow. Thus, the light extraction efficiency of the light emitting device 100 can be improved.

Figure 4C:
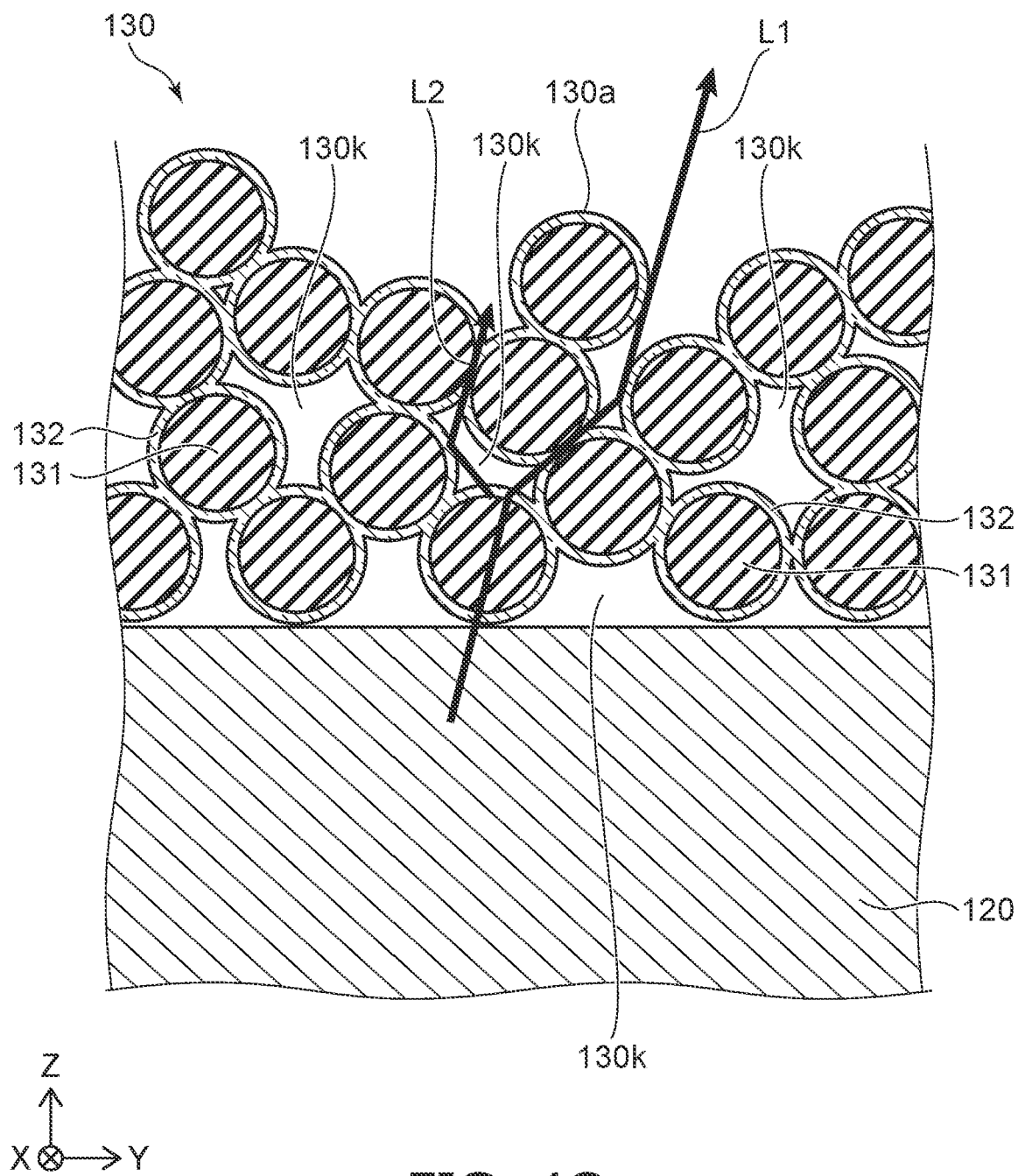
FIG. 4C is a schematic diagram illustrating an example of a path of light at an end surface in which a part of the light emitting element and a part of the wavelength conversion layer in FIG. 2 are illustrated in an enlarged manner.

FIG. 4C is a schematic diagram illustrating an example of a path of light at an end surface in which a part of the light emitting element and a part of the wavelength conversion layer in FIG. 2 are illustrated in an enlarged manner.

In the present embodiment, the wavelength conversion particles 131 are covered by the glass layer 132. Therefore, when the first light L1 emitted from the light emitting element 120 and the second light L2 emitted from the wavelength conversion layer 130 are incident on the glass layer 132 from the air layer 130k in the wavelength conversion layer 130, the first light L1 and the second light L2 are likely to be reflected at a boundary surface between the air layer 130k and the glass layer 132. Thus, propagation of light in the lateral direction is blocked in the wavelength conversion layer 130, and the light is emitted from the region S1 directly above the light emitting element 120 and the wavelength conversion layer 130. Thus, the contrast between the peripheral region S2 and the region S1 directly above the light emitting element 120 and the wavelength conversion layer 130 can be increased.

Next, a method of manufacturing the light emitting device 100 according to the present embodiment will be described.

FIGS. 5A to 5F are schematic diagrams illustrating a method of manufacturing the light emitting device 100 according to the present embodiment.

Figure 5A:
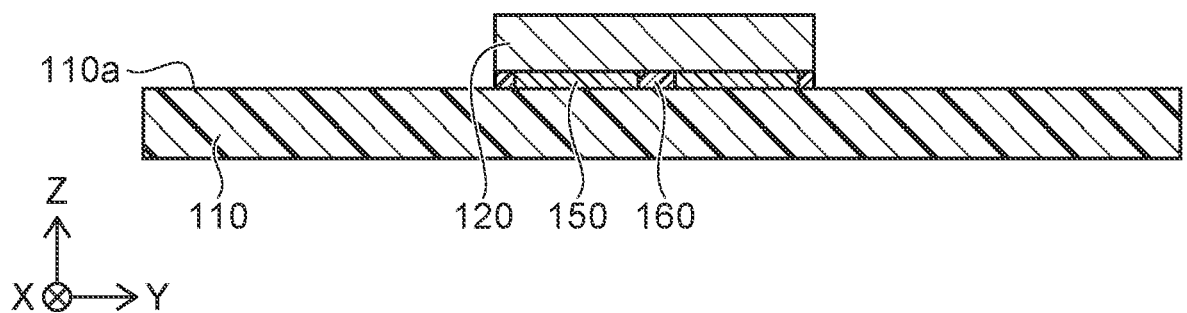
FIG. 5A is a schematic diagram illustrating a method of manufacturing a light emitting device according to a first embodiment.

As illustrated in FIG. 5A, the light emitting element 120 is mounted on the substrate 110. In the present embodiment, the light emitting element 120 is joined to the substrate 110 with the conductive joint member 150. In the present embodiment, the light shielding layer 160 is provided between the light emitting element 120 and the substrate 110.

Figure 5B:
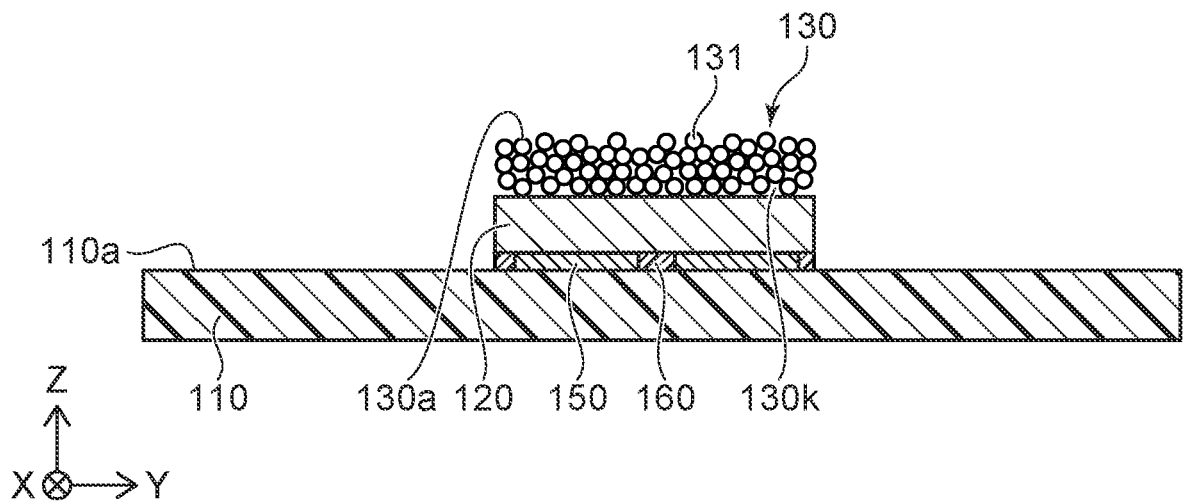
FIG. 5B is a schematic diagram illustrating the method of manufacturing the light emitting device according to the first embodiment.

Subsequently, as illustrated in FIG. 5B, the wavelength conversion layer 130 is arranged on the light emitting element 120. The wavelength conversion layer 130 is provided by spraying a slurry material containing the plurality of wavelength conversion particles 131.

Specifically, a mask material is provided so as to surround the light emitting element 120, the slurry material is sprayed onto the light emitting element 120, and the mask material is removed. The slurry material contains polysilazane, the plurality of wavelength conversion particles 131, and an organic solvent. Heptane or dibutyl ether, for example, is used as the organic solvent. A slurry material not containing an organic solvent can be used. The slurry material contains no resin material. Subsequently, the base onto which the slurry material is sprayed is heated or left at room temperature to convert the polysilazane into silica. Thus, the wavelength conversion particles 131 are covered with the glass layer 132 containing the silica and the air layer 130k is formed between the wavelength conversion particles 131. Thus, the wavelength conversion layer 130 is formed on the light emitting element 120.

The method of disposing the wavelength conversion layer is not limited to the method described above. For example, the slurry material to be sprayed need not contain polysilazane and can contain a binder including a resin material such as a silicone resin. The wavelength conversion layer can be provided by electrostatically adhering the wavelength conversion particles to each other and electrostatically adhering the wavelength conversion particles and the light emitting element. The wavelength conversion layer 130 formed by the light transmissive plate in which the plurality of wavelength conversion particles are dispersed can be disposed on the top surface of the light emitting element 120.

Figure 5C:
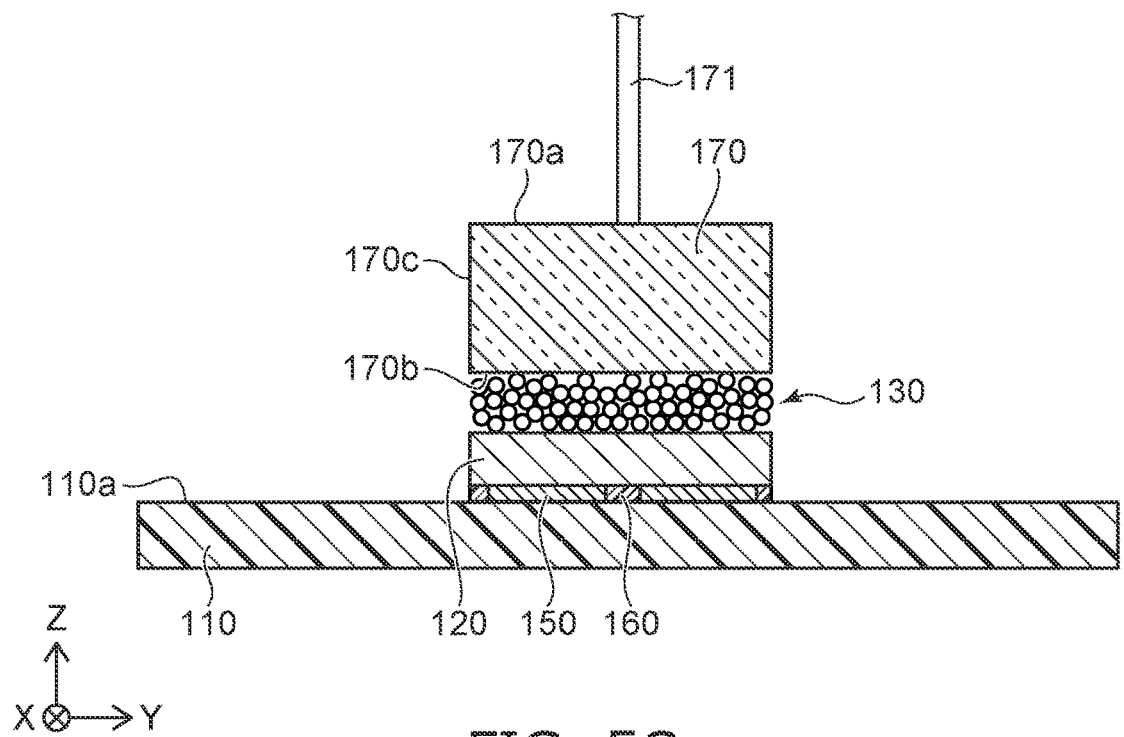
FIG. 5C is a schematic diagram illustrating the method of manufacturing the light emitting device according to the first embodiment.

Subsequently, as illustrated in FIG. 5C, a mold member 170 is placed on the wavelength conversion layer 130. The mold member 170 is held by a holding tool 171, for example. The mold member 170 is a plate member. The surface of the mold member 170 includes a top surface 170a, a bottom surface 170b, and a lateral surface 170c.

The top surface 170a and the bottom surface 170b are flat surfaces. The bottom surface 170b is located on a side opposite to the top surface 170a and faces the wavelength conversion layer 130. The lateral surface 170c is in contact with the top surface 170a and the bottom surface 170b, and is perpendicular to the top surface 170a and the bottom surface 170b. The mold member 170 is arranged such that the top surface 170a and the bottom surface 170b are parallel to the top surface 110a of the substrate 110.

The mold member 170 is disposed at a position overlapping three light emitting elements 120 in a top view. The mold member 170 is preferably formed of a light transmissive material, and is formed of glass or a Teflon (registered trademark) sheet, for example. In the case in which the mold member 170 is formed of a light transmissive material, the light emitting element 120 and the wavelength conversion layer 130 can be visually recognized from above the mold member 170 in a state where the mold member 170 is placed on the wavelength conversion layer 130. Thus, when placing the mold member 170, the mold member 170 can be easily positioned with respect to the light emitting element 120 and the wavelength conversion layer 130. However, the mold member 170 can also be formed of a metal material.

Figure 5D:
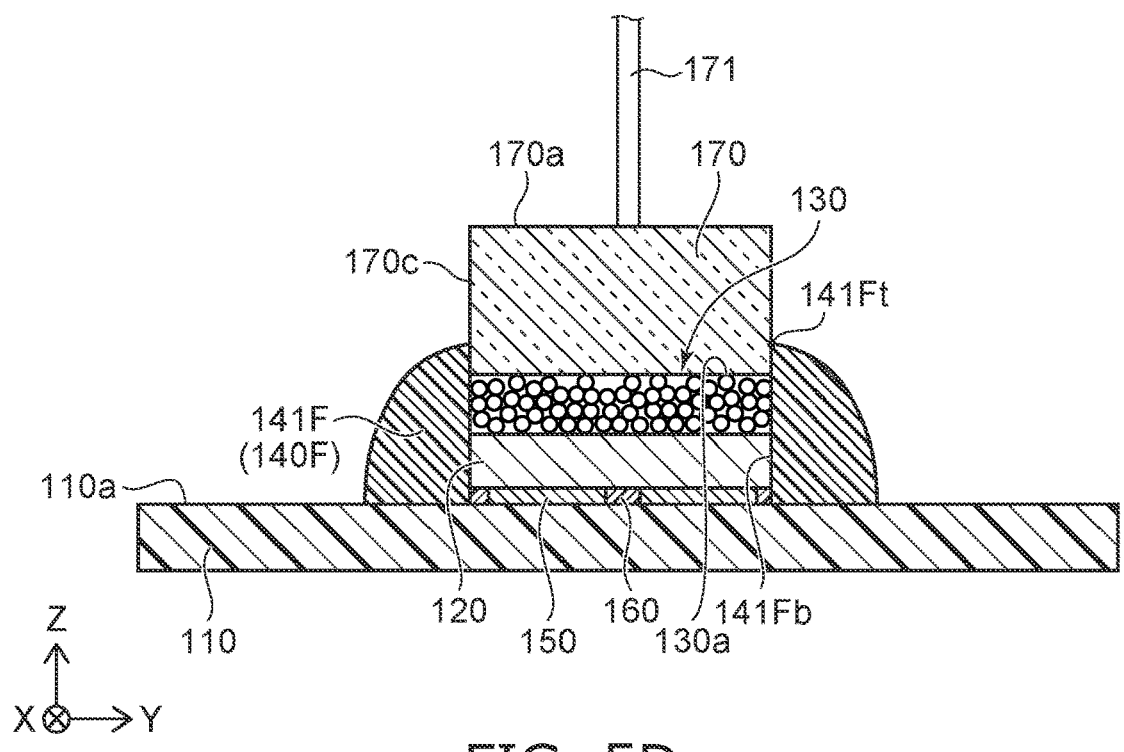
FIG. 5D is a schematic diagram illustrating the method of manufacturing the light emitting device according to the first embodiment.
Figure 5E:
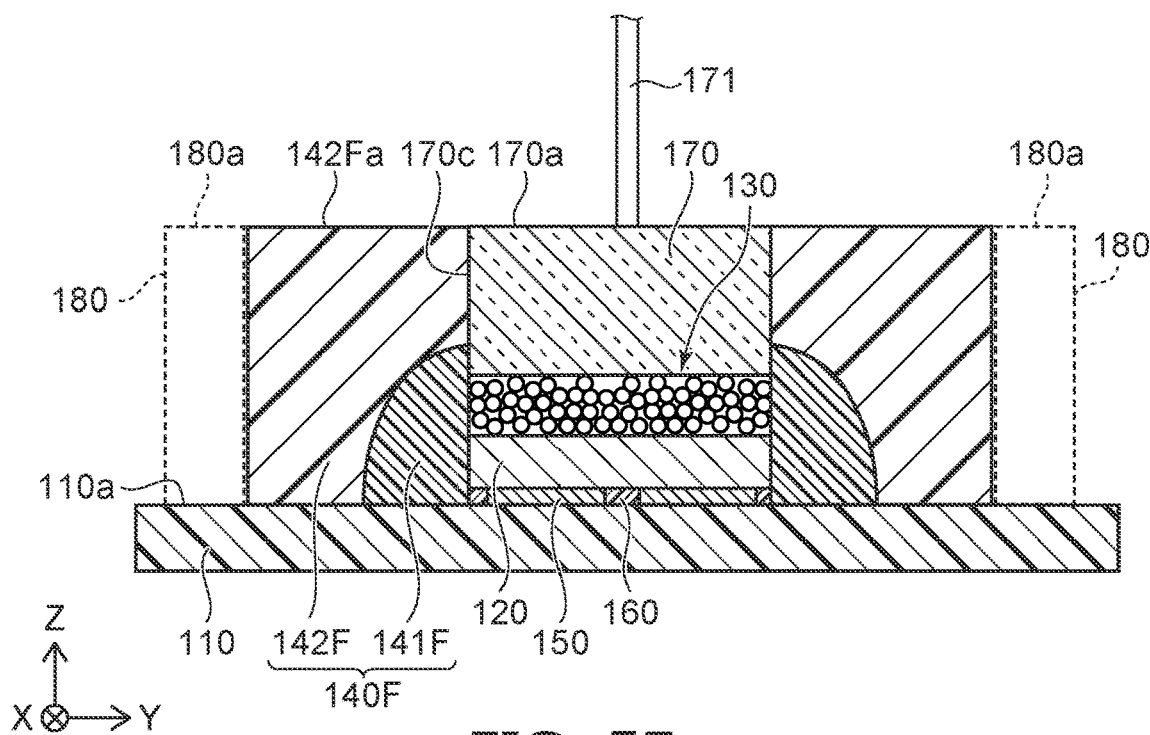
FIG. 5E is a schematic diagram illustrating the method of manufacturing the light emitting device according to the first embodiment.
Figure 5F:
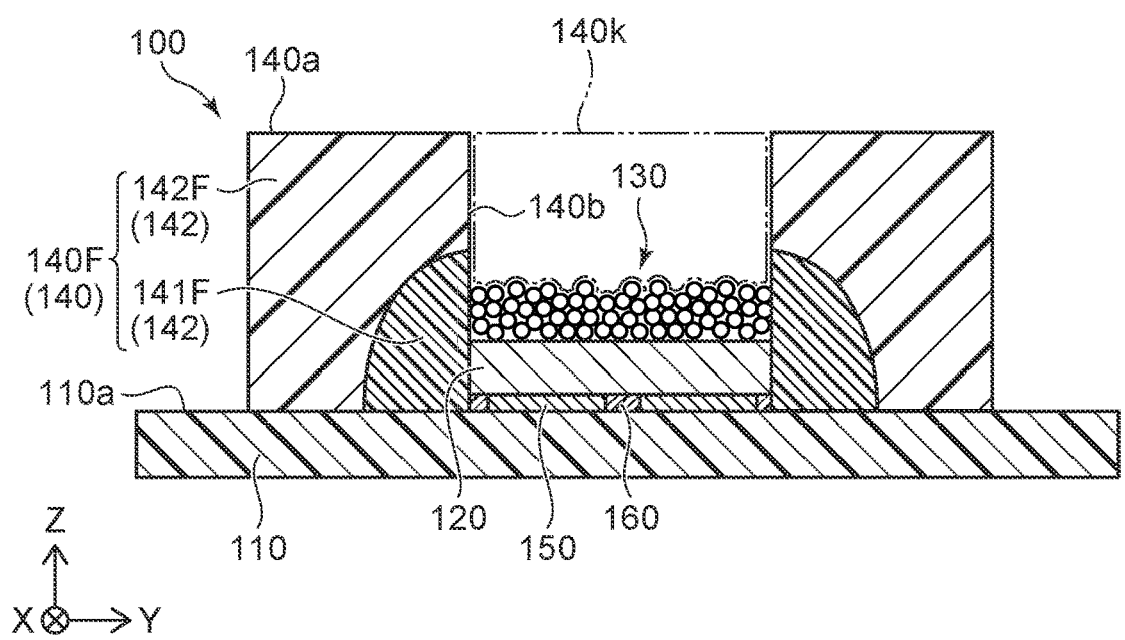
FIG. 5F is a schematic diagram illustrating the method of manufacturing the light emitting device according to the first embodiment.

Subsequently, as illustrated in FIGS. 5D and 5E, an uncured light reflecting material 140F is provided so as to surround the wavelength conversion layer 130 and the mold member 170. At this time, the uncured light reflecting material 140F is provided such that the top surface 140a of the light reflecting material 140F after curing, which is illustrated in FIG. 5F, is parallel to the top surface 110a of the substrate 110.

The uncured light reflecting material 140F includes a base material formed of an uncured resin material, and a filler formed of a light reflective material. A thermosetting resin such as a silicone resin or an epoxy resin can be used as the resin material of the light reflecting material 140F. Silicon oxide ($SiO_2$), titanium oxide ($TiO_2$), aluminum (Al), silver (Ag), or the like can be used as the light reflective material of the light reflecting material 140F. The light reflecting material 140F can contain a thickening agent. The term "uncured" means that the light reflecting material 140F is at least not completely cured and is flexible enough to be deformed to match the shape of the mold member 170. The "light reflecting material 140F after curing" means the light reflecting material 140F which is completely cured and corresponds to the wall 140.

Next, a step of providing the uncured light reflecting material 140F will be described in detail, using an example where the uncured light reflecting material 140F includes a first member 141F and a second member 142F. The first member 141F and the second member 142F each include a base material formed of an uncured resin material and a filler formed of a light reflective material, and differ from each other in terms of concentration of the filler. After the first member 141F is cured, the first member 141F forms the first portion 141 of the wall 140. After the second member 142F is cured, the second member 142F forms the second portion 142 of the wall 140.

First, as illustrated in FIG. 5D, the first member 141F is provided so as to surround the wavelength conversion layer 130 and a lower region of the lateral surface 170c of the mold member 170 and in contact with the lower region of the lateral surface 170c of the mold member 170. The uncured first member 141F preferably has a viscosity such that after being provided to surround the wavelength conversion layer 130 and the mold member 170, the first member 141F does not flow into the wavelength conversion layer 130. For example, the viscosity of the uncured first member 141F is preferably in a range from 450 Pa s to 1000 Pa s. This may make it possible to prevent the first member 141F from flowing into the wavelength conversion layer 130 while bringing an inner surface 141Fb of the uncured first member 141F into contact with the lower region of the lateral surface 170c of the mold member 170.

A region between the top surface 130a of the wavelength conversion layer 130 and an upper end 141Ft located at the uppermost position in the inner surface 141Fb of the uncured first member 141F is in contact with the lower region of the lateral surface 170c of the mold member 170. Thus, the first region 141s perpendicular to the top surface 110a of the substrate 110 is formed in the first portion 141 which is the first member 141F after curing, as illustrated in FIG. 2.

Subsequently, the first member 141F is semi-cured. The first member 141F need not necessarily be semi-cured.

Subsequently, as illustrated in FIG. 5E, the second member 142F is provided over the first member 141F and surround the first member 141F. The viscosity of the uncured second member 142F is lower than the viscosity of the uncured first member 141F. A method of decreasing the viscosity of the second member 142F than the viscosity of the first member 141F is not particularly limited. Examples of the method include a method of decreasing the concentration of a filler contained in the second member 142F than the concentration of a filler contained in the first member 141F, and a method of decreasing the amount of a thickening agent added to the second member 142F than the amount of a thickening agent added to the first member 141F.

The uncured second member 142F preferably has a viscosity such that the second member 142F can be fluidal along the shape of the lateral surface 170c of the mold member 170. For example, the viscosity of the second member 142F is preferably in a range from 5 Pa s to 250 Pa s. When disposing the second member 142F, a frame member 180 that surrounds the mold member 170 and the first member 141F can be provided with a distance from the mold member 170 and the first member 141F, and the second member 142F can be disposed between the mold member 170 and the frame member 180.

In the present embodiment, the second member 142F is provided such that the cured top surface 140a is parallel to the top surface 110a of the substrate 110. For example, if a top surface 142Fa of the uncured second member 142F is located below the top surface 170a of the mold member 170 and a top surface 180a of the frame member 180, the second member 142F spreads onto the top surface 170a of the mold member 170 and the top surface 180a of the frame member 180 due to surface tension, and thus, the top surface 142Fa of the uncured second member 142F is recessed in a direction approaching the substrate 110.

On the other hand, in the present embodiment, the uncured second member 142F is provided such that the top surface 142Fa of the uncured second member 142F is flush with the top surfaces 170a and 180a. Thus, the top surface 142Fa of the uncured second member 142F is parallel to the top surface 110a of the substrate 110. With this configuration, the top surface 140a after curing is parallel to the top surface 110a of the substrate 110. As a result, the angle θ of the corner portion c of the light reflecting material 140F after curing (i.e., the wall 140) can be 90 degrees. When it is expected that the top surface 140a of the cured second member 142F is located lower than the top surface 142Fa of the uncured second member 142F and is recessed in the direction approaching the substrate 110, the uncured second member 142F can be provided such that the top surface 142Fa of the uncured second member 142F protrudes in the direction from the top surface 110a of the substrate 110 to the top surface 140a of the light reflecting material 140F. In this case, the top surface 142Fa can be flattened by polishing or the like after the second member 142F is cured.

As described above, the first member 141F is in contact with the lower region of the lateral surface 170c of the mold member 170 and surrounds the wavelength conversion layer 130. Therefore, the second member 142F can be made to flow along the shape of the lateral surface 170c of the mold member 170 while being suppressed from flowing into the wavelength conversion layer 130 by the first member 141F.

Subsequently, the light reflecting material 140F is cured. If the base material of the light reflecting material 140F is a thermosetting resin, the light reflecting material 140F is cured by being heated. The heating temperature is in a range from 150° C. to 200° C., for example. However, the curing method can be appropriately selected according to the material of the light reflecting material 140F. For example, the resin in the light reflecting material 140F can be formed of an ultraviolet curable resin and cured by ultraviolet rays.

Subsequently, as illustrated in FIG. 5F, the mold member 170 and the frame member 180 are removed from the substrate 110. Specifically, the mold member 170 is detached from the cured light reflecting material 140F by applying a force in a direction in which the mold member 170 is pulled apart from the cured light reflecting material 140F. Thus, the light emitting device 100 is formed with the angle θ of the corner portion c of the wall 140 in the range from 90 degrees to less than 180 degrees.

Next, an effect of the present embodiment will be described.

In the light emitting device 100 according to the present embodiment, the top surface 140a of the wall 140 is positioned higher than the position of the top surface 130a of the wavelength conversion layer 130. Furthermore, the angle θ of the corner portion c between the top surface 140a and the inner surface 140b of the wall 140 is in the range from 90 degrees to less than 180 degrees. Thus, even if the second light L2 propagates into the wall 140, emission of the propagated second light L2 from the top surface 140a can be suppressed. Therefore, a light emitting device 100 in which light can be suppressed from leaking from the top surface 140a of the wall 140 can be provided. Also with this configuration, the contrast between the peripheral region S2 and the region 51 directly above the light emitting element 120 and the wavelength conversion layer 130 can be increased.

The opening portion 140k is hollow. Thus, the light extraction efficiency of the light emitting device 100 can be improved.

The wall 140 includes a base material formed of a resin material, and a filler that is dispersed in the base material and formed of a light reflective material. The density of the filler contained in the first portion 141 is higher than the density of the filler contained in the second portion 142. Thus, the reflectance of the first portion 141 can be set higher than the reflectance of the second portion 142. As a result, the second light L2 is less likely to propagate into the first portion 141 adjacent to the wavelength conversion layer 130.

In such a configuration, the viscosity of the uncured first member 141F is higher than the viscosity of the uncured second member 142F during manufacturing. Thus, the second member 142F can be easily caused to flow along the shape of the lateral surface 170c of the mold member 170 while being suppressed from flowing into the wavelength conversion layer 130 by the first member 141F.

A region (e.g., the second region 142s1) of the inner surface 140b of the wall 140, the region includes the upper end 142t is perpendicular to the top surface 110a of the substrate 110. Thus, the contrast between the peripheral region S2 and the region S1 directly above the light emitting element 120 and the wavelength conversion layer 130 can be further increased.

The distance between the top surface 130a of the wavelength conversion layer 130 and the top surface 140a of the wall 140 is in a range from 50 μm to 2000 μm. There may be a case in which the second light L2 propagates into the wall 140 from a region of the inner surface 140b of the wall 140, the region being adjacent to the wavelength conversion layer 130. Even in this case, the propagated second light L2 is attenuated and the second light L2 can be suppressed from leaking from the top surface 140a of the wall 140 by allowing the top surface 130a of the wavelength conversion layer 130 and the top surface 140a of the wall 140 to be sufficiently separated.

The top surface 140a of the wall 140 is parallel to the top surface 110a of the substrate 110. Therefore, the thickness t of the corner portion c can be increased further than in a case in which the top surface 140a of the wall 140 is recessed in the direction approaching the top surface 110a of the substrate 110. Thus, light leakage from the top surface 140a of the wall 140 can be suppressed.

The wavelength conversion layer 130 contains the plurality of wavelength conversion particles 131, and the top surface 130a of the wavelength conversion layer 130 has protrusions and recesses resulting from the plurality of wavelength conversion particles 131. With this configuration, the light distribution angle can be a narrow angle, and thus the luminance of the light emitting device 100 can be enhanced.

The wavelength conversion layer 130 further includes the glass layer 132 that covers the surface of the wavelength conversion particles 131. The wavelength conversion particles 131 are bonded to each other via the glass layer 132, and the air layer 130k is formed between the wavelength conversion particles 131 covered by the glass layer 132. Thus, the contrast between the peripheral region S2 and the region S1 directly above the light emitting element 120 and the wavelength conversion layer 130 can be further increased.

In the method of manufacturing the light emitting device 100 according to the present embodiment, first, the light emitting element 120 is mounted on the substrate 110. Subsequently, the wavelength conversion layer 130 is disposed on the light emitting element 120. Then, the mold member 170 is placed on the wavelength conversion layer 130.

Subsequently, the uncured light reflecting material 140F is disposed surrounding the wavelength conversion layer 130 and the mold member 170 such that the top surface 140a of the cured light reflecting material 140F is parallel to the top surface 110a of the substrate 110. Then, the light reflecting material 140F is cured to form the wall 140. Subsequently, the mold member 170 is removed to form, in the wall 140, the hollow opening portion 140k that exposes at least a part of the top surface 130a of the wavelength conversion layer 130. According to this method of manufacturing, the light emitting device 100, in which light leakage from the top surface 140a of the wall 140 can be suppressed, can be manufactured.

The light reflecting material 140F includes the first member 141F and the second member 142F, and the step of providing the light reflecting material 140F includes a step of providing the first member 141F so as to surround the wavelength conversion layer 130, and a step of providing the second member 142F over the first member 141F and surrounding the first member 141F. The viscosity of the second member 142F is lower than the viscosity of the first member 141F. Thus, the second member 142F can be easily caused to flow along the shape of the lateral surface 170c of the mold member 170 while the second member 142F is suppressed from flowing into the wavelength conversion layer 130 by the first member 141F.

If the mold member 170 is formed of a light transmissive material, positioning and disposition of the mold member 170 can be easily performed with respect to the light emitting element 120 and the wavelength conversion layer 130.

Second Embodiment

Next, a second embodiment will be described.

Figure 6:
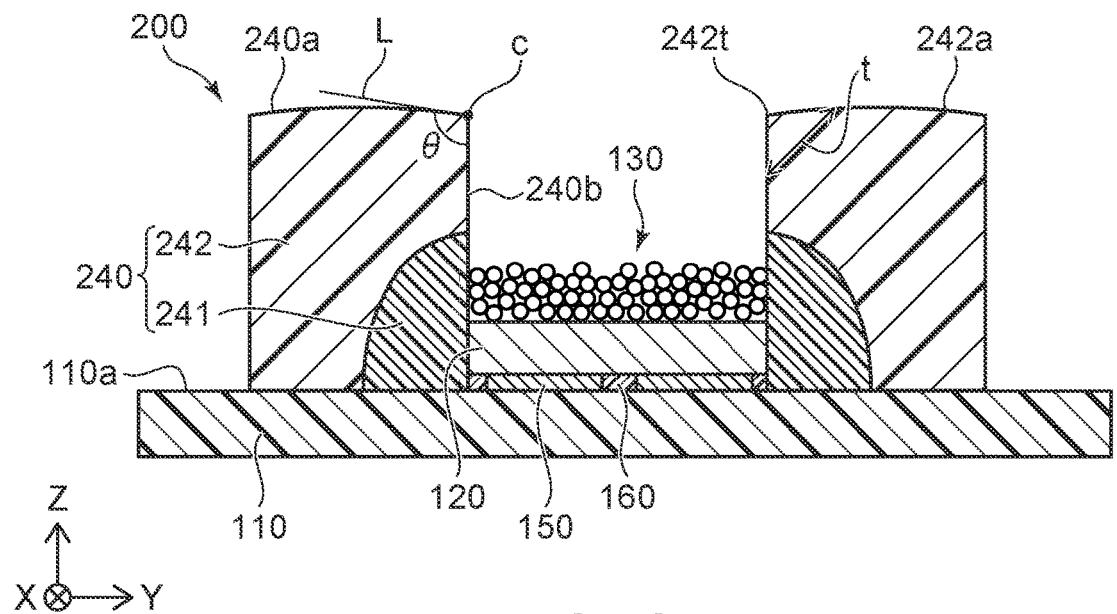
FIG. 6 is a schematic end view illustrating a light emitting device according to a second embodiment.

FIG. 6 is a schematic end view illustrating a light emitting device 200 according to the present embodiment.

The light emitting device 200 according to the present embodiment differs from the light emitting device 100 according to the first embodiment in that a top surface 242a of a second portion 242 of a wall 240 is not parallel to the top surface 110a of the substrate 110. In the following description, in general, only differences from the first embodiment will be described. The second embodiment is the same as or a similar to the first embodiment, except for the points described below.

The wall 240 includes a first portion 241 and the second portion 242. The configuration of the first portion 241 is substantially the same as the configuration of the first portion 141 in the first embodiment, and thus, description of the first portion 241 will be omitted.

The configuration of the second portion 242 is substantially the same as the configuration of the second portion 142 in the first embodiment, except for the shape of the top surface 242a. The top surface 242a of the second portion 242 is a curved surface that protrudes toward the direction from the top surface 110a of the substrate 110 to the top surface 242a of the second portion 242.

A top surface 240a of the entire wall 240 includes the top surface 242a of the second portion 242. Thus, the angle θ of the corner portion c between the top surface 240a and an inner surface 240b of the wall 240 is in a range of 90 degrees or greater and less than 180 degrees. Here, the angle θ is an angle formed by the inner surface 240b and a tangent line L of the top surface 242a passing through an upper end 242t of the inner surface 240b. Thus, the angle θ can be greater than 90 degrees. In this case, the thickness t of the corner portion c can be further increased. Thus, even if the second light L2 propagates into the wall 240 from a region of the inner surface 240b of the wall 240 near the corner portion c, the propagated second light L2 is attenuated, and the second light L2 can be suppressed from leaking from the top surface 240a.

Next, a method of manufacturing the light emitting device 200 according to the present embodiment will be described.

Figure 7:
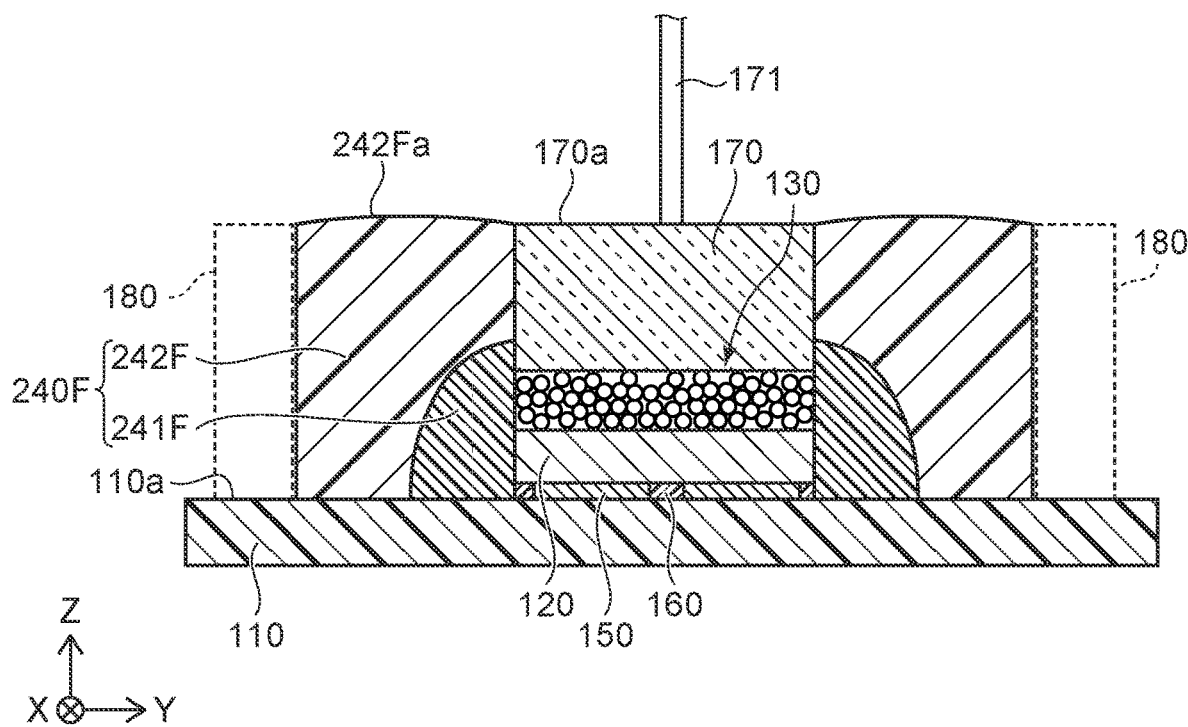
FIG. 7 is a schematic diagram illustrating a method of manufacturing the light emitting device according to the second embodiment.

FIG. 7 is a schematic diagram illustrating the method of manufacturing the light emitting device 200 according to the present embodiment.

The method of manufacturing according to the present embodiment is different from the method of manufacturing of the light emitting device 100 according to the first embodiment in terms of a step of providing a second member 242F included in a light reflecting material 240F.

The light reflecting material 240F includes a first member 241F and the second member 242F. Each of the first member 241F and the second member 242F contains a base material formed of an uncured resin material, and a filler formed of a light reflective material. After the first member 241F is cured, the first member 241F forms the first portion 241 of the wall 240. After the second member 242F is cured, the second member 242F forms the second portion 242 of the wall 240.

The process until the step of providing the first member 241F is the same as or a similar to the process until the step of providing the first member 141F in the method of manufacturing the light emitting device 100 according to the first embodiment, and thus, description of this process will be omitted.

After the first member 241F is provided, the second member 242F is provided such that the cured top surface 240a protrudes in the direction from the top surface 110a of the substrate 110 to the top surface 240a of the wall 240, as illustrated in FIG. 7. Specifically, the uncured second member 242F is provided such that a top surface 242Fa protrudes in the direction from the top surface 110a of the substrate 110 to the top surface 240a of the wall 240 due to surface tension. Thus, the top surface 242a of the cured second member 242F protrudes in the direction from the top surface 110a of the substrate 110 to the top surface 240a of the wall 240. The subsequent procedure is the same as or a similar to the first embodiment.

Next, an effect of the present embodiment will be described.

In the present embodiment, the top surface 242a of the wall 240 protrudes toward the direction from the substrate 110 to the top surface 240a of the wall 240. Thus, the thickness t of the corner portion c can be further increased. Therefore, even if the second light L2 propagates into the wall 240 from a region of the inner surface 240b of the wall 240 near the corner portion c, the propagated second light L2 is attenuated, and the second light L2 can be suppressed from leaking from the top surface 242a.

Third Embodiment

Next, a third embodiment will be described.

Figure 8:
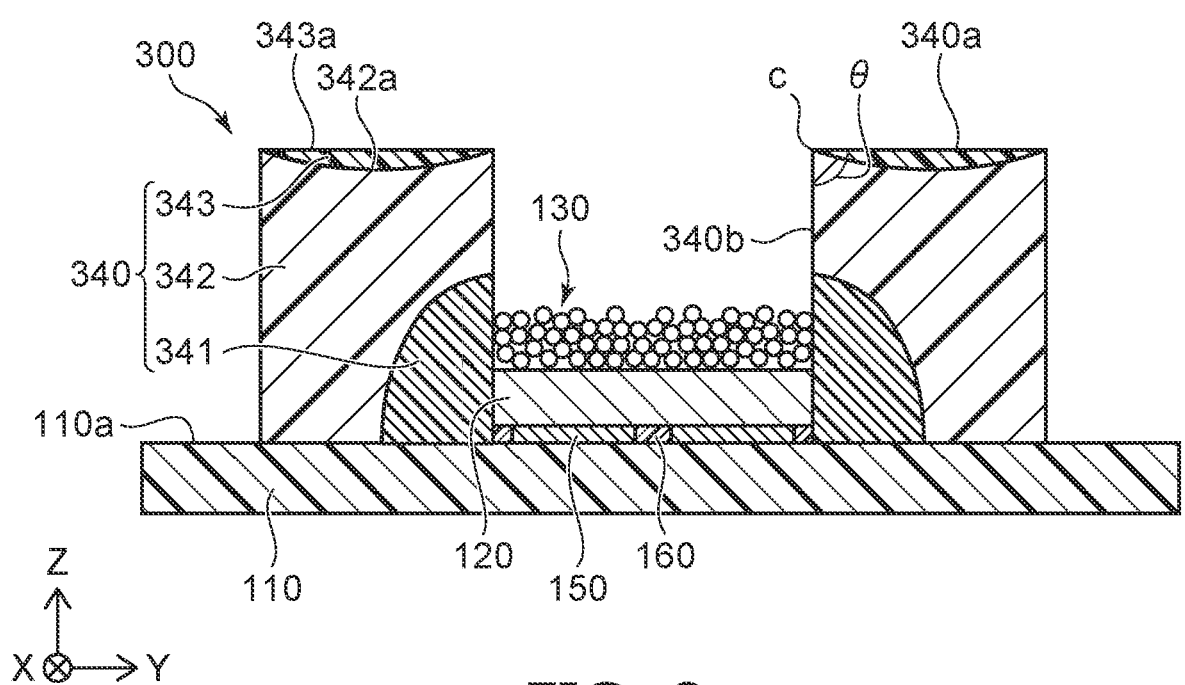
FIG. 8 is a schematic end view illustrating a light emitting device according to a third embodiment.

FIG. 8 is a schematic end view illustrating a light emitting device 300 according to the present embodiment.

The light emitting device 300 according to the present embodiment differs from the light emitting device 100 according to the first embodiment in terms of the configuration of a wall 340.

The wall 340 includes a first portion 341, a second portion 342, and a filler portion 343. The configuration of the first portion 341 is the same as or a similar to the configuration of the first portion 141 in the first embodiment, and thus, description of the first portion 341 will be omitted.

The configuration of the second portion 342 is the same as or similar to the configuration of the second portion 142 in the first embodiment, except for the shape of a top surface 342a. The top surface 342a of the second portion 342 is recessed in the direction approaching the substrate 110.

The filler portion 343 is provided in the recess in the top surface 342a of the second portion 342. The filler portion 343 contains a base material formed of a resin material, and a filler dispersed in the base material. A thermosetting resin such as a silicone resin or an epoxy resin can be used as the resin material. A light reflective material such as silicon oxide ($SiO_2$), titanium oxide ($TiO_2$), aluminum (Al), and silver (Ag), or a light absorbing material such as carbon particles formed of carbon powder can be used as the filler.

A top surface 343a of the filler portion 343 is parallel to the top surface 110a of the substrate 110. However, the filler portion 343 can protrude in the direction from the substrate 110 to the top surface 343a of the filler portion 343. A top surface 340a of the entire wall 340 includes the top surface 343a of the filler portion 343. Thus, the angle θ of the corner portion c between the top surface 340a and an inner surface 340b of the wall 340 can be in a range of 90 degrees or greater and less than 180 degrees.

If the filler in the filler portion 343 is formed of a light reflective material, the density of the filler included in the filler portion 343 is preferably higher than the density of the filler included in the second portion 342. With this configuration, the second light L2 that has propagated into the wall 340 can be further suppressed from leaking from the top surface 343a.

If the filler in the filler portion 343 is formed of a light absorbing material, the filler in the filler portion 343 can absorb the second light L2 that has propagated into the wall 340. With this configuration, the second light L2 that has propagated into the wall 340 can be further suppressed from leaking from the top surface 343a.

Fourth Embodiment

Next, a fourth embodiment will be described.

Figure 9:
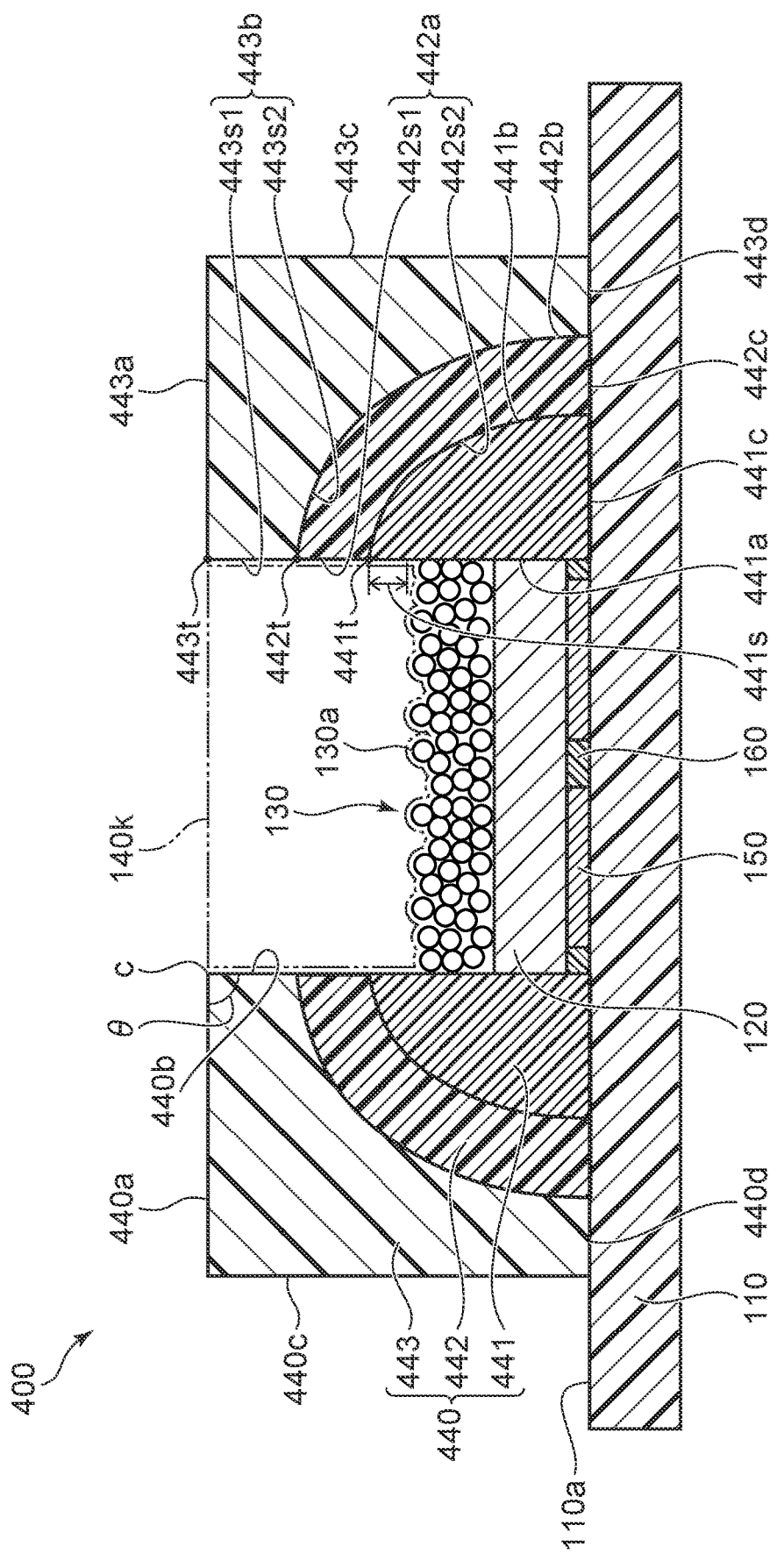
FIG. 9 is a schematic end view illustrating a light emitting device according to a fourth embodiment.

FIG. 9 is a schematic end view illustrating a light emitting device 400 according to the present embodiment.

The light emitting device 400 according to the present embodiment differs from the light emitting device 100 according to the first embodiment in terms of the configuration of a wall 440.

The wall 440 includes a first portion 441, a second portion 442, and a third portion 443. The first portion 441 is provided to surround the light emitting element 120 and the wavelength conversion layer 130. The second portion 442 is provided over the first portion 441 and surrounds the first portion 441. The third portion 443 is provided over the second portion 442 and surrounds the second portion 442.

Each of the first portion 441, the second portion 442, and the third portion 443 contains a base material formed of a resin material, and a filler formed of a light reflective material. The density of the filler contained in the first portion 441 is higher than the density of the filler contained in the second portion 442. The density of the filler contained in the second portion 442 is higher than the density of the filler contained in the third portion 443. Thus, the light reflectance of the first portion 441 is higher than the light reflectance of the second portion 442, and the light reflectance of the second portion 442 is higher than the light reflectance of the third portion 443.

The surface of the first portion 441 includes an inner surface 441a, an outer surface 441b, and a bottom surface 441c. The inner surface 441a surrounds the light emitting element 120 and the wavelength conversion layer 130, and is in contact with a lateral surface of the light emitting element 120 and an end portion of the wavelength conversion layer 130 in the lateral direction. An upper end 441t located at the uppermost position in the inner surface 441a is located above the top surface 130a of the wavelength conversion layer 130. A first region 441s located between the upper end 441t and the top surface 130a of the wavelength conversion layer 130 in the inner surface 441a is perpendicular to the top surface 110a of the substrate 110.

The outer surface 441b surrounds the inner surface 441a and is in contact with the inner surface 441a and the bottom surface 441c. The outer surface 441b extends so as to become farther from the inner surface 441a as advancing in the downward direction. However, the top surface of the first portion 441 can be located between the inner surface 441a and the outer surface 441b. In this case, the outer surface 441b can be perpendicular to the top surface 110a of the substrate 110. The bottom surface 441c is in contact with the top surface 110a of the substrate 110.

The surface of the second portion 442 includes an inner surface 442a, an outer surface 442b, and a bottom surface 442c.

The inner surface 442a surrounds the first portion 441. An upper end 442t located at the uppermost position in the inner surface 442a is located above the upper end 441t of the first portion 441.

The inner surface 442a includes a second region 442s1 located between the upper end 442t and the upper end 441t of the first portion 441, and a third region 442s2 located between the upper end 441t and the bottom surface 442c. The second region 442s1 is perpendicular to the top surface 110a of the substrate 110 and flush with the inner surface 441a of the first portion 441.

The outer surface 442b is provided to surround the inner surface 442a and contacts the inner surface 442a and the bottom surface 442c. A portion of the top surface 110a can exist between the inner surface 442a and the outer surface 442b. The bottom surface 442c contacts the top surface 110a of the substrate 110.

The third portion 443 is provided over the second portion 442 and surrounds the second portion 442.

The surface of the third portion 443 includes a top surface 443a, an inner surface 443b, an outer surface 443c, and a bottom surface 443d. The top surface 443a is parallel to the top surface 110a of the substrate 110. However, the top surface 443a can protrude in the direction from the substrate 110 to the top surface 443a of the third portion 443.

An upper end 443t located at the uppermost position in the inner surface 443b is located above the upper end 442t of the second portion 442. The inner surface 443b includes a fourth region 443s1 located between the upper end 443t and the upper end 442t, and a fifth region 443s2 located between the upper end 442t and the bottom surface 443d. The fourth region 443s1 is in contact with the top surface 443a. The fourth region 443s1 is perpendicular to the top surface 110a of the substrate 110. The fourth region 443s1 is flush with the second region 442s1 of the second portion 442. The fifth region 443s2 is in contact with the outer surface 442b of the second portion 442.

The outer surface 443c is provided to surround the top surface 443a and is in contact with the top surface 443a and the bottom surface 443d. The outer surface 443c is perpendicular to the top surface 110a of the substrate 110. However, the outer surface 443c can be inclined with respect to the top surface 110a of the substrate 110. The bottom surface 443d is in contact with the top surface 110a of the substrate 110.

Thus, a top surface 440a of the entire wall 440 includes the top surface 443a of the third portion 443. An inner surface 440b of the entire wall 440 includes the inner surface 441a of the first portion 441, the second region 442s1 of the second portion 442, and the second region 443s1 of the third portion 443. An outer surface 440c of the entire wall 440 includes the outer surface 443c of the third portion 443. A bottom surface 440d of the entire wall 440 includes the bottom surface 441c of the first portion 441, the bottom surface 442c of the second portion 442, and the outer surface 443c of the third portion 443. The angle θ of the corner portion c between the top surface 440a and the inner surface 440b of the wall 440 is in a range of 90 degrees or greater and less than 180 degrees.

Next, a method of manufacturing the light emitting device 400 according to the present embodiment will be described.

Figure 10A:
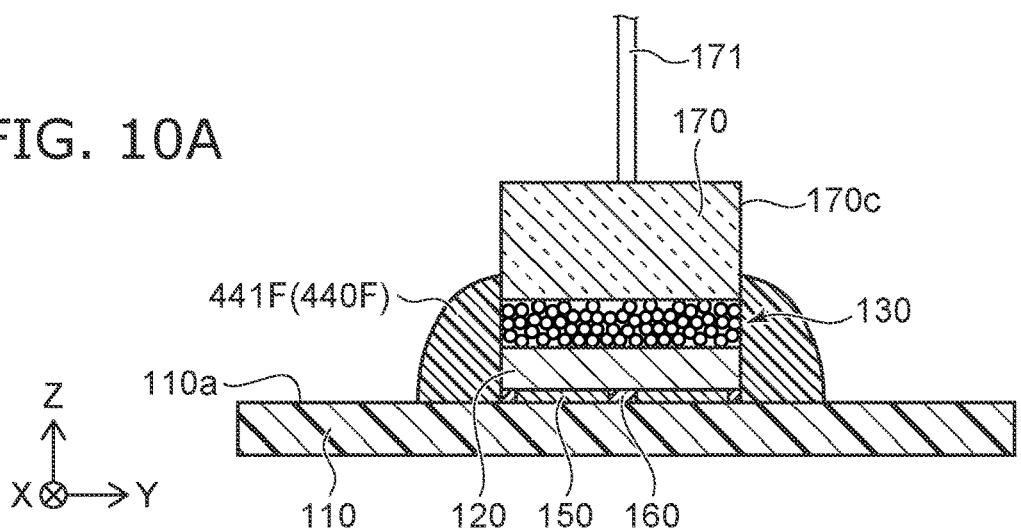
FIG. 10A is a schematic diagram illustrating a method of manufacturing the light emitting device according to the fourth embodiment.
Figure 10B:
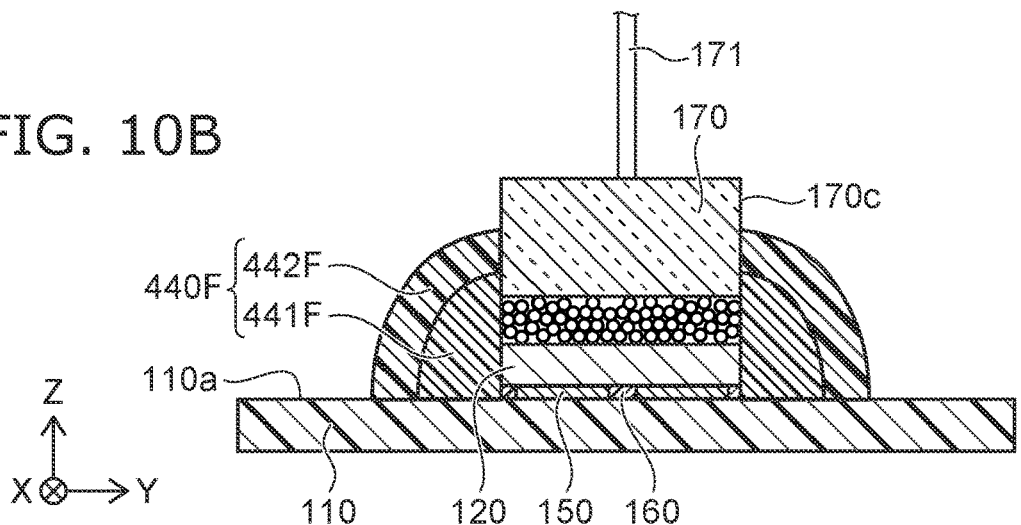
FIG. 10B is a schematic diagram illustrating the method of manufacturing the light emitting device according to the fourth embodiment.
Figure 10C:
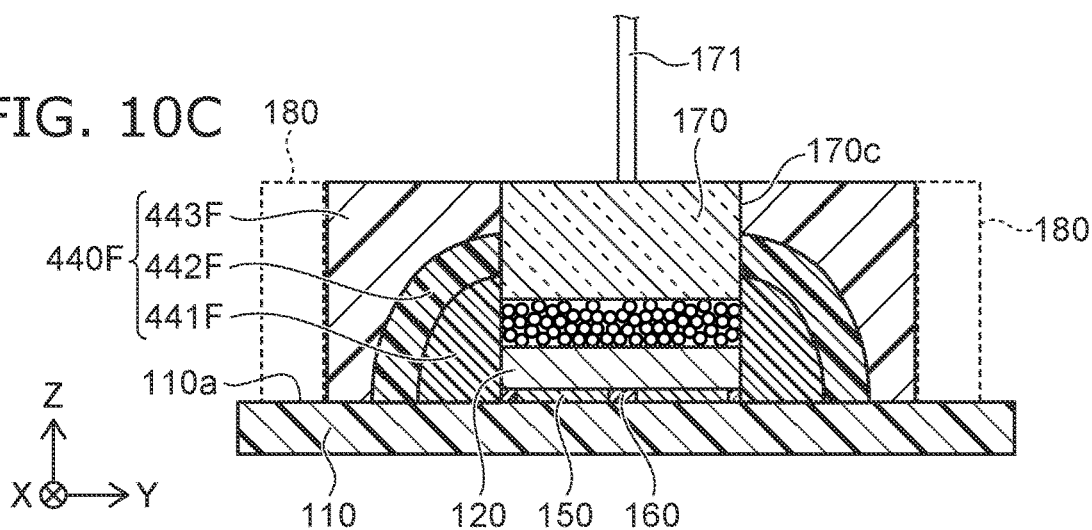
FIG. 10C is a schematic diagram illustrating the method of manufacturing the light emitting device according to the fourth embodiment.

FIGS. 10A to 10C are schematic diagrams illustrating the method of manufacturing the light emitting device 400 according to the present embodiment.

The method of manufacturing according to the present embodiment is different from the method of manufacturing the light emitting device 100 according to the first embodiment in terms of a step of providing a light reflecting material 440F.

The light reflecting material 440F includes a first member 441F, a second member 442F, and a third member 443F. The first member 441F, the second member 442F, and the third member 443F each contain a base material formed of an uncured resin material and a filler formed of a light reflective material, and differ from each other in terms of concentration of the filler. After the first member 441F is cured, the first member 441F forms the first portion 441 of the wall 440. After the second member 442F is cured, the second member 442F forms the second portion 442 of the wall 440. After the third member 443F is cured, the third member 443F forms the third portion 443 of the wall 440. A method of providing the light reflecting material 440F will be described in detail below.

As illustrated in FIG. 10A, similar to the first embodiment, the first member 441F is provided so as to surround the wavelength conversion layer 130 and a lower region of the lateral surface 170c of the mold member 170, and be in contact with the lower region of the lateral surface 170c of the mold member 170.

Subsequently, the first member 441F is semi-cured. Semi-cure of the first member 441F need not necessarily be performed.

Subsequently, as illustrated in FIG. 10B, the second member 442F is provided over the first member 441F and surrounding the first member 441F. The viscosity of the uncured second member 442F is lower than the viscosity of the uncured first member 441F. Therefore, the second member 442F can be sufficiently brought into contact with the lateral surface 170c of the mold member 170 while being suppressed from flowing into the wavelength conversion layer 130 by the first member 441F.

Subsequently, the second member 442F is semi-cured. The semi-cure of the second member 442F need not necessarily be performed.

Subsequently, as illustrated in FIG. 10C, the third member 443F is provided over the second member 442F and surrounding the second member 442F. At this time, the third member 443F is provided such that the cured top surface 440a is parallel to the top surface 110a of the substrate 110. The third member 443F can be provided such that the cured top surface 440a protrudes in the direction from the top surface 110a of the substrate 110 to the top surface 440a of the wall 440. The viscosity of the uncured third member 443F is lower than the viscosity of the uncured second member 442F. Thus, the third member 443F flows along the shape of the lateral surface 170c of the mold member 170.

As described above, before the third member 443F is provided, the first member 441F and the second member 442F contact the lateral surface 170c of the mold member 170 and cover the wavelength conversion layer 130. Therefore, the third member 443F can be deformed along the shape of the lateral surface 170c of the mold member 170 while being suppressed from flowing into the wavelength conversion layer 130 by both the first member 441F and the second member 442F.

Subsequently, the first member 441F, the second member 442F, and the third member 443F are cured. The subsequent procedure is the same as or a similar to the first embodiment.

Next, an effect of the present embodiment will be described.

In the light emitting device 400 according to the present embodiment, the wall 440 further includes the third portion 443 provided over the second portion 442 and surrounding the second portion 442. The density of the filler contained in the third portion 443 is lower than the density of the filler contained in the second portion 442. Thus, the reflectance of the second portion 442 can be made higher than the reflectance of the third portion 443. Therefore, propagation of the second light L2 in the wall 440 can be further suppressed.

The viscosity of the uncured second member 442F during manufacturing is higher than the viscosity of the uncured third member 443F. Therefore, the third member 443F can be deformed along the shape of the lateral surface 170c of the mold member 170 while being suppressed from flowing into the wavelength conversion layer 130 by both the first member 441F and the second member 442F.

In the embodiment described above, an example is described in which the wall 440 includes the three portions 441, 442, and 443 having different filler densities. However, the wall 440 can include four or more portions having different filler densities.

Fifth Embodiment

Next, a fifth embodiment will be described.

Figure 11:
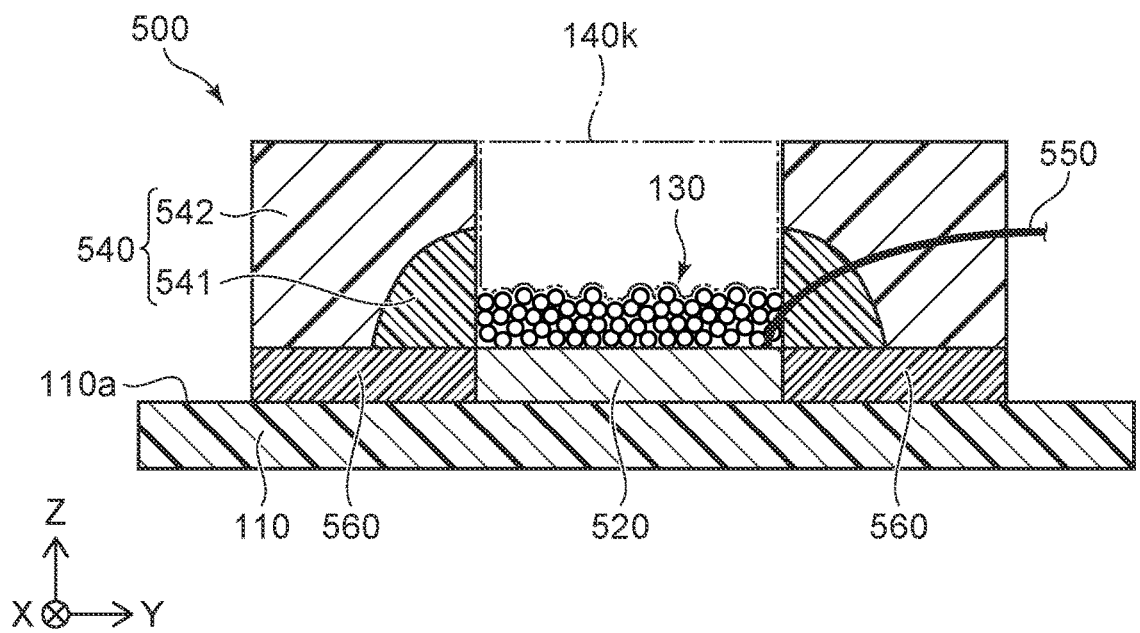
FIG. 11 is a schematic end view illustrating a light emitting device according to a fifth embodiment.

FIG. 11 is a schematic end view illustrating a light emitting device 500 according to the present embodiment.

The light emitting device 500 according to the present embodiment differs from the light emitting device 100 according to the first embodiment in that a light emitting element 520 is an LED that is mounted on the substrate 110 such that a growth substrate side of the light emitting element 520 faces the substrate 110 (i.e., face-up mounting).

The light emitting element 520 is mounted on the substrate 110. An electrode on a top surface of the light emitting element 520 is connected to one end of a wire 550. The other end of the wire 550 is connected to an electrode on the substrate 110 (not illustrated). A light shielding layer 560 is provided around the light emitting element 520.

The light shielding layer 560 is in contact with the top surface 110a of the substrate 110. The light shielding layer 560 includes a base material formed of a resin material, and a filler dispersed in the base material. A thermosetting resin such as a silicone resin or an epoxy resin can be used as the base material of the light shielding layer 560. A light reflective material such as titanium oxide ($TiO_2$) can be used as the filler of the light shielding layer 560. A wall 540 is provided on the light shielding layer 560, and a part of the wire 550 is embedded in the wall 540.

The wall 540 includes a first portion 541 and a second portion 542. The configuration of the first portion 541 and the second portion 542 is the same as or a similar to the configuration of the first portion 141 and the second portion 142 in the first embodiment except that the first portion 541 and the second portion 542 are in contact with the light shielding layer 560.

Thus, the light emitting element 520 can be mounted face up. The wall 540 is only required to surround at least the wavelength conversion layer 130 and need not necessarily surround the light emitting element 520.

Sixth Embodiment

Next, a sixth embodiment will be described.

Figure 12:
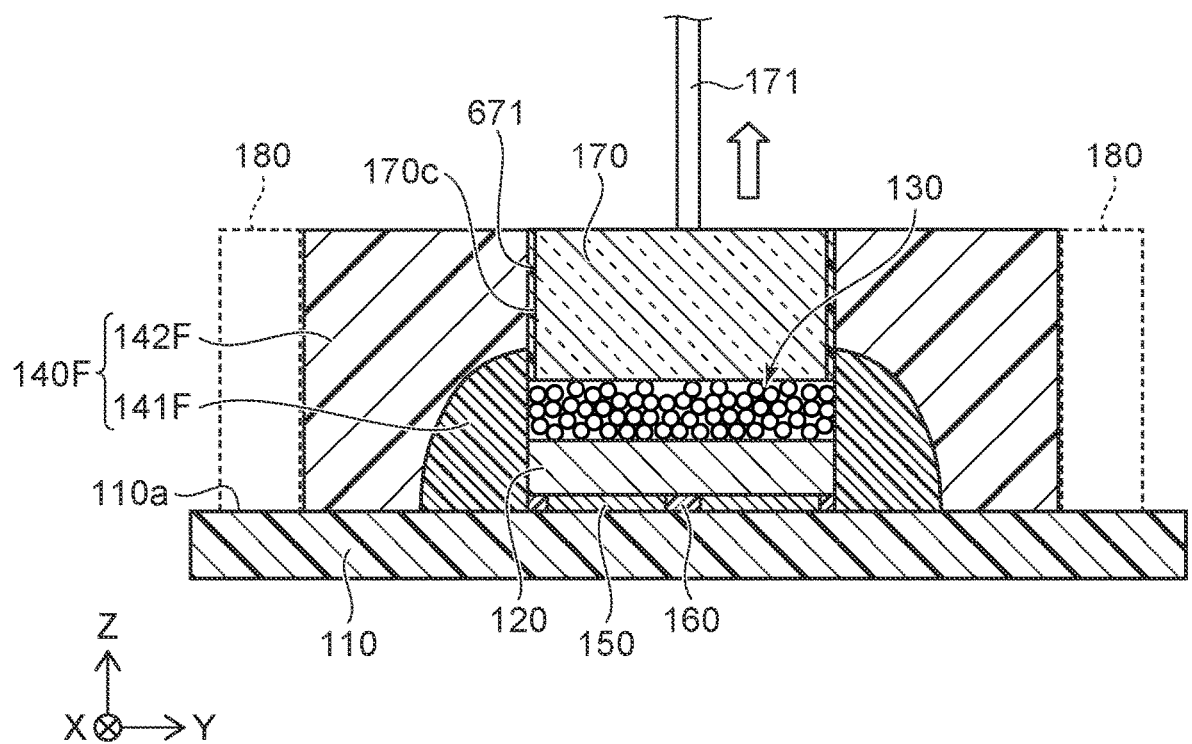
FIG. 12 is a schematic diagram illustrating a method of manufacturing a light emitting device according to a sixth embodiment.

FIG. 12 is a schematic diagram illustrating a method of manufacturing the light emitting device 100 according to the present embodiment.

The method of manufacturing the light emitting device 100 according to the present embodiment differs from the method of manufacturing the light emitting device 100 according to the first embodiment in that a film 671 is disposed on the lateral surface 170c of the mold member 170.

Before the light reflecting material 140F is provided, the film 671 is disposed on the lateral surface 170c of the mold member 170. The film 671 includes a mold release agent that assists in removing the mold member 170 from the cured light reflecting material 140F. A fluorine-based coating agent or a silicone-based coating agent can be used as the mold release agent. However, the film 671 can be a gold-plated film. Resin and gold do not tend to strongly adhere to each other. Thus, if the film 671 is a gold-plated film, the mold member 170 can be easily removed from the cured light reflecting material 140F.

Next, as illustrated in FIG. 12, the light reflecting material 140F is provided in a similar manner as in the first embodiment. The subsequent procedure is the same as or a similar to the first embodiment.

Seventh Embodiment

Next, a seventh embodiment will be described.

Figure 13:
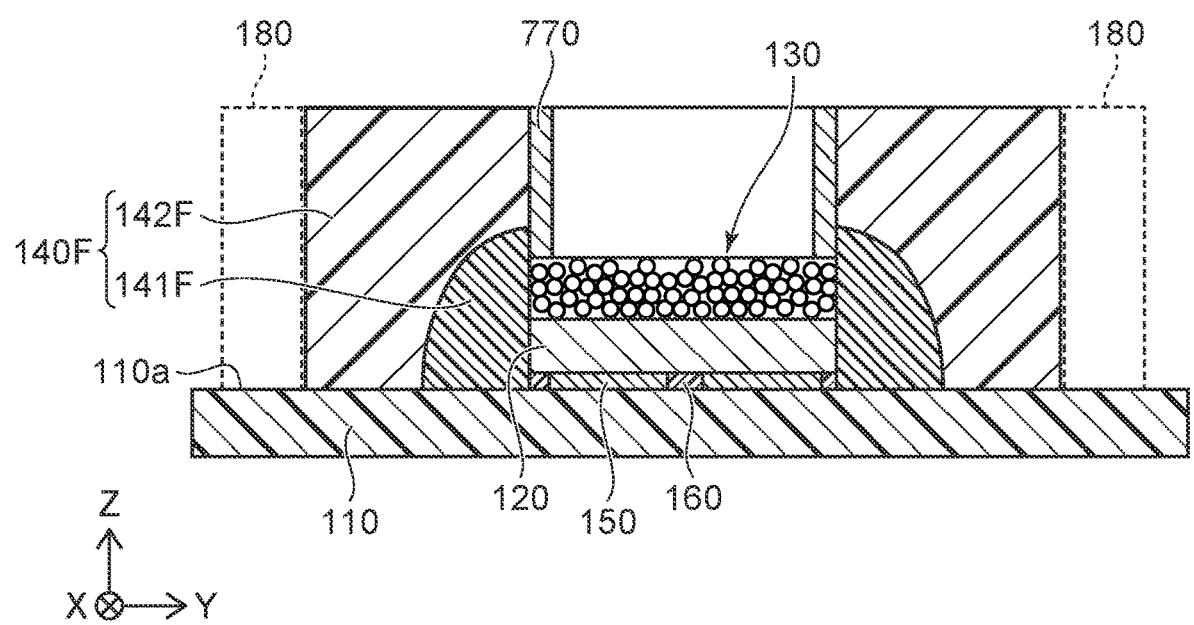
FIG. 13 is a schematic diagram illustrating a method of manufacturing a light emitting device according to a seventh embodiment.

FIG. 13 is a schematic diagram illustrating a method of manufacturing the light emitting device 100 according to the present embodiment.

The method of manufacturing the light emitting device 100 according to the present embodiment differs from the method of manufacturing the light emitting device 100 according to the first embodiment in that a mold member 770 is not a plate like member.

The mold member 770 can be a tubular member. The shape of the mold member 770 is a hollow rectangular parallelepiped. The mold member 770 can be formed of a resin material or a metal material. A mold release agent or gold plating can be provided on a lateral surface of the mold member 770.

Similar to the mold member 170 in the first embodiment, the mold member 770 is removed after the light reflecting material 140F is cured.

Eighth Embodiment

Next, an eighth embodiment will be described.

FIGS. 14A to 14D are schematic diagrams illustrating a method of manufacturing a light emitting device 800 according to the present embodiment.

The method of manufacturing the light emitting device 800 according to the present embodiment differs from the method of manufacturing the light emitting device 100 according to the first embodiment in that the mold member 170 is made to temporarily adhere to the wavelength conversion layer 130.

Figure 14A:
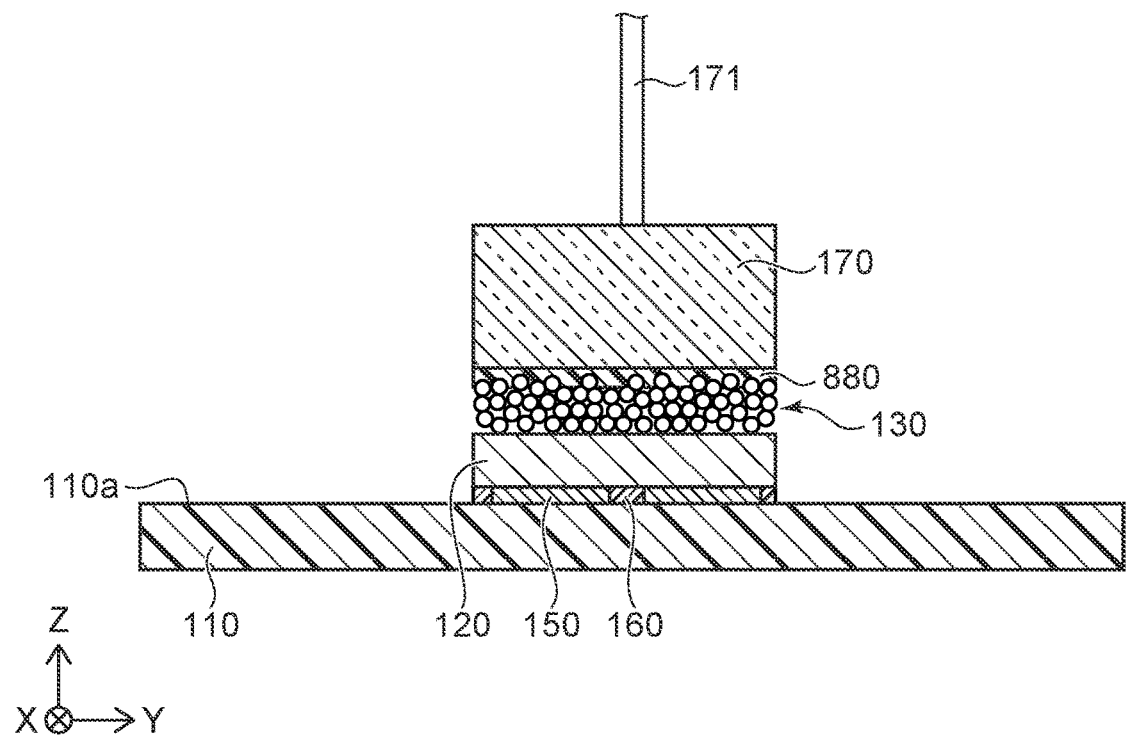
FIG. 14A is a schematic diagram illustrating a method of manufacturing a light emitting device according to an eighth embodiment.

As illustrated in FIG. 14A, in the step of disposing the mold member 170, an adhesive agent 880 is provided between the mold member 170 and the wavelength conversion layer 130 such that the mold member 170 and the wavelength conversion layer 130 temporarily adhere to each other. The term "temporarily adhere" means that, when a force separating the mold member 170 and the wavelength conversion layer 130 is applied after the light reflecting material 140F is cured, the mold member 170 and the wavelength conversion layer 130 adhere to each other with an adhesive force having a strength at which adhesion between the mold member 170 and the wavelength conversion layer 130 can be released without damaging the mold member 170 and the wavelength conversion layer 130.

A phenyl-based adhesive agent can be used as the adhesive agent 880. In the case in which the adhesive agent 880 is formed of the phenyl-based adhesive agent, the mold member 170 and the wavelength conversion layer 130 can be easily detached. However, the adhesive agent 880 can also be a water soluble adhesive agent.

Figure 14B:
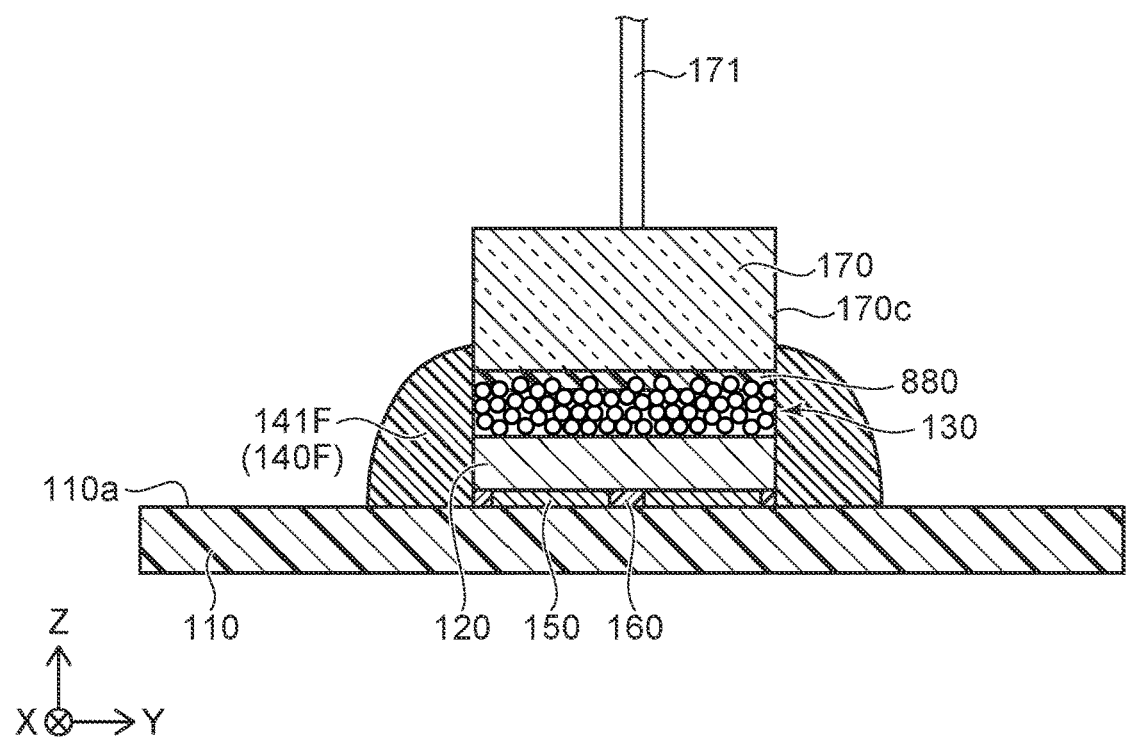
FIG. 14B is a schematic diagram illustrating the method of manufacturing the light emitting device according to the eighth embodiment.
Figure 14C:
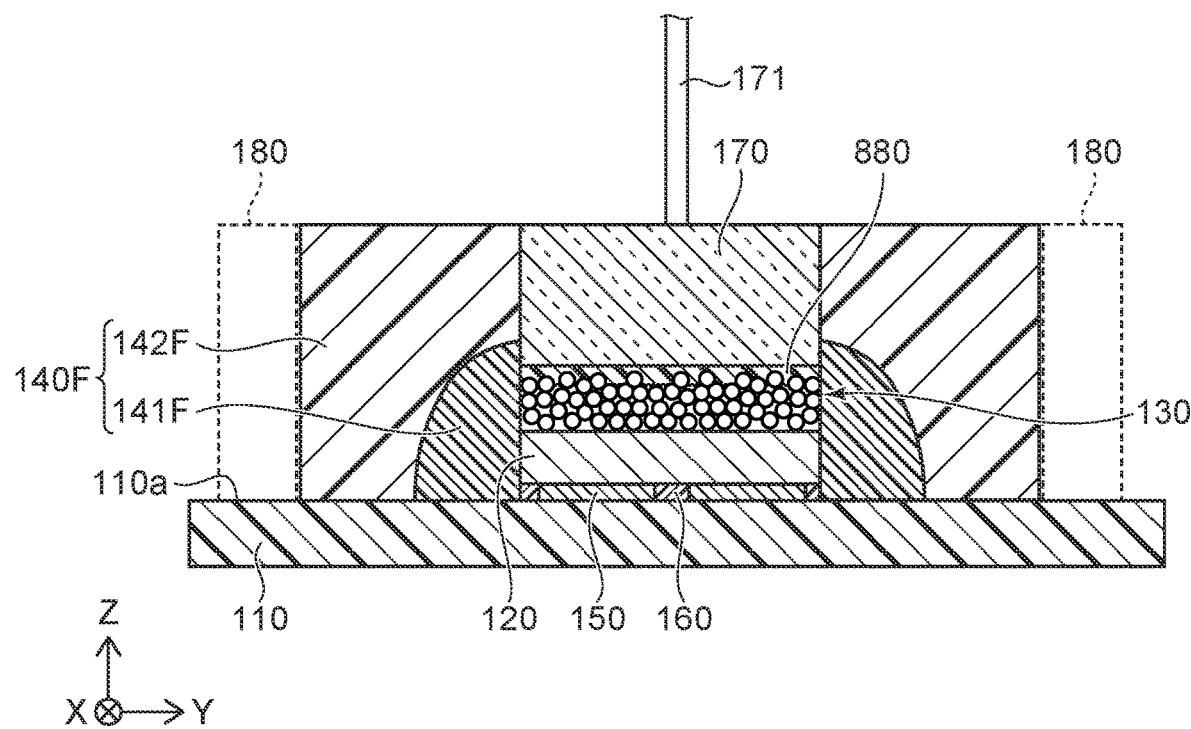
FIG. 14C is a schematic diagram illustrating the method of manufacturing the light emitting device according to the eighth embodiment.

Next, as illustrated in FIG. 14B, the first member 141F of the light reflecting material 140F is provided. Then, as illustrated in FIG. 14C, the second member 142F of the light reflecting material 140F is provided. In these steps, the mold member 170 is caused to temporarily adhere to the wavelength conversion layer 130. Thus, when providing the light reflecting material 140F, displacement of the mold member 170 relative to the light emitting element 120 and the wavelength conversion layer 130 can be suppressed.

Next, the light reflecting material 140F is cured.

Figure 14D:
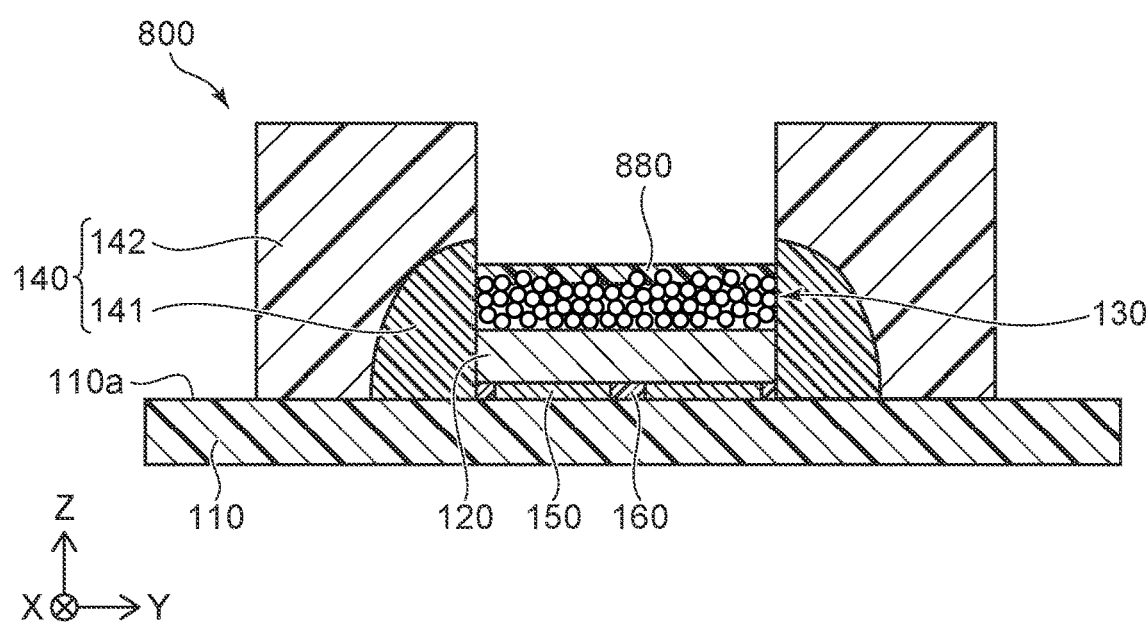
FIG. 14D is a schematic end view illustrating the light emitting device according to the eighth embodiment.

Then, as illustrated in FIG. 14D, the mold member 170 is removed. Thus, the light emitting device 800 is formed. In FIG. 14D, after the mold member 170 is removed, the adhesive agent 880 remains on an upper portion of the wavelength conversion layer 130. However, when the adhesive agent 880 adheres to the mold member 170 at a strength higher than to the wavelength conversion layer 130, the adhesive agent 880 is removed together with the mold member 170. When the adhesive agent 880 is a water soluble adhesive agent, the adhesive agent 880 can be dissolved in water or an aqueous solution and removed after the step of removing the mold member 170.

Next, an effect of the present embodiment will be described.

In the method of manufacturing the light emitting device 800 according to the present embodiment, in the step of disposing the mold member 170, the adhesive agent 880 is provided between the mold member 170 and the wavelength conversion layer 130 such that the mold member 170 temporarily adheres to the wavelength conversion layer 130. Therefore, displacement of the mold member 170 when the light reflecting material 140F is provided can be suppressed.

In the method of manufacturing the light emitting device 800 according to the present embodiment, the adhesive agent 880 is water soluble, and after the step of removing the mold member 170, the adhesive agent 880 is dissolved in water or an aqueous solution and removed. Therefore, the adhesive agent 880 can be suppressed from remaining on the wavelength conversion layer 130. Thus, the light extraction efficiency of the light emitting device 800 can be improved.

Ninth Embodiment

Next, a ninth embodiment will be described.

Figure 15A:
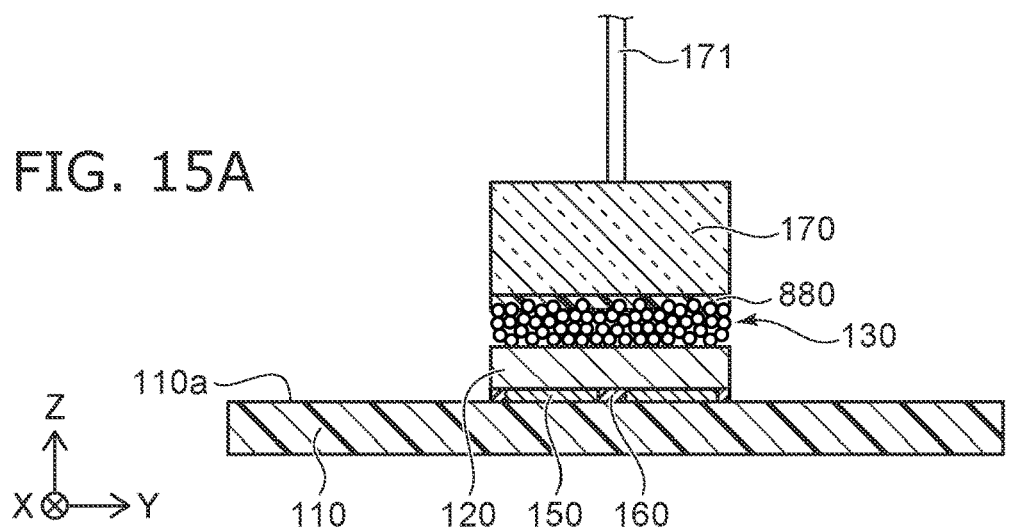
FIG. 15A is a schematic diagram illustrating a method of manufacturing a light emitting device according to a ninth embodiment.
Figure 15B:
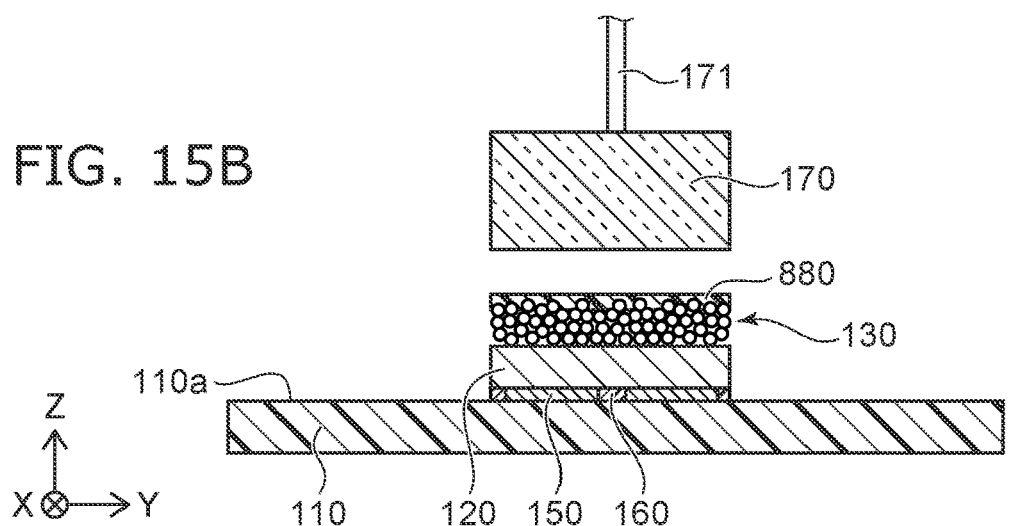
FIG. 15B is a schematic diagram illustrating the method of manufacturing the light emitting device according to the ninth embodiment.
Figure 15C:
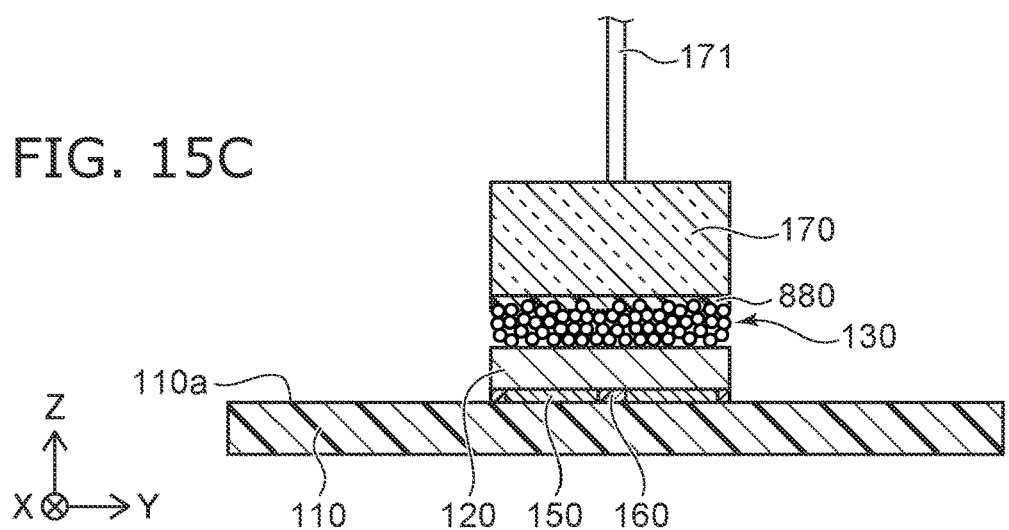
FIG. 15C is a schematic diagram illustrating the method of manufacturing the light emitting device according to the ninth embodiment.

FIGS. 15A to 15C are schematic diagrams illustrating a method of manufacturing the light emitting device 800 according to a modification of the present embodiment.

The method of manufacturing the light emitting device 800 according to the present embodiment differs from the method of manufacturing the light emitting device 800 according to the eighth embodiment in that, after the mold member 170 is caused to temporarily adhere to the wavelength conversion layer 130, the mold member 170 is temporarily detached from the wavelength conversion layer 130.

As illustrated in FIG. 15A, in the step of disposing the mold member 170, the adhesive agent 880 is provided between the mold member 170 and the wavelength conversion layer 130 such that the mold member 170 temporarily adheres to the wavelength conversion layer 130.

Next, as illustrated in FIG. 15B, the mold member 170 is temporarily detached from the wavelength conversion layer 130.

Then, as illustrated in FIG. 15C, the mold member 170 and the wavelength conversion layer 130 temporarily adhere to each other again. With this configuration, the adhesive force between the mold member 170 and the wavelength conversion layer 130 can be reduced.

The subsequent procedure is the same as or a similar to the eighth embodiment.

Next, an effect of the present embodiment will be described.

In the method of manufacturing the light emitting device 800 according to the present embodiment, in the step of disposing the mold member 170, the adhesive agent 880 is provided between the mold member 170 and the wavelength conversion layer 130 such that the mold member 170 and the wavelength conversion layer 130 temporarily adhere to each other. Subsequently, the mold member 170 is temporarily detached from the wavelength conversion layer 130. Then, the mold member 170 and the wavelength conversion layer 130 are caused to temporarily adhere to each other again. With this configuration, the adhesive force between the mold member 170 and the wavelength conversion layer 130 can be reduced. Therefore, the mold member 170 can be easily removed after the light reflecting material 140F is cured.

In the plurality of embodiments described above, an example is described in which the mold member is removed by detaching the mold member. However, the mold member can be formed of a material that sublimates by being heated such that the mold member is removed by being heated. If the light reflecting material is cured by being heated, a step of sublimating the mold member is preferably performed simultaneously with the step of heating and curing the light reflecting material. The mold member preferably sublimates in a range from 150° C. to 200° C., for example.

Embodiments of the present disclosure can be utilized in various types of light sources for illumination, in-vehicle light sources, and the like.

What is claimed is:

1. A method of manufacturing a light emitting device, the method comprising:
    disposing a light emitting element on a substrate;
    disposing a wavelength conversion layer on the light emitting element;
    placing a mold member on the wavelength conversion layer;
    providing a light reflecting material that is uncured so as to surround the wavelength conversion layer and the mold member such that a top surface of the light reflecting material after being cured protrudes toward a direction from the substrate to the top surface of the light reflecting material or is parallel to a top surface of the substrate;
    forming a wall by curing the light reflecting material; and
    removing the mold member to form a hollow opening portion in the wall, the hollow opening portion exposing at least a part of a top surface of the wavelength conversion layer,
    wherein the light reflecting material includes a first member and a second member,
    wherein the providing the light reflecting material includes:
        providing the first member so as to surround the wavelength conversion layer, and
        providing the second member over the first member and surrounding the first member, and
    wherein a viscosity of the first member is higher than a viscosity of the second member.

2. The method of manufacturing a light emitting device according to claim 1, wherein
    the light reflecting material includes a third member,
    the providing the light reflecting material includes providing the third member over the second member and surrounding the second member, and wherein
    a viscosity of the third member is lower than the viscosity of the second member.

3. The method of manufacturing a light emitting device according to claim 1, wherein the mold member is formed of a light transmissive material.

4. The method of manufacturing a light emitting device according to claim 1, wherein the mold member is a plate like member.

5. The method of manufacturing a light emitting device according to claim 1, wherein a mold release agent is provided on a surface of the mold member.

6. The method of manufacturing a light emitting device according to claim 1, wherein gold plating is provided on a surface of the mold member.

7. The method of manufacturing a light emitting device according to claim 1,
    wherein the disposing the wavelength conversion layer includes:
    spraying a slurry material containing polysilazane and a plurality of wavelength conversion particles onto the light emitting element, and
    converting the polysilazane into silica by heating or leaving, at room temperature, a base on which the slurry material is sprayed, to thereby cover each of the plurality of wavelength conversion particles with a glass layer containing the silica and form an air layer between the plurality of wavelength conversion particles.

8. The method of manufacturing a light emitting device according to claim 1, wherein in the placing the mold member, an adhesive agent is provided between the mold member and the wavelength conversion layer such that the mold member is made to temporarily adhere to the wavelength conversion layer.

9. The method of manufacturing a light emitting device according to claim 8, wherein
    the adhesive agent is water soluble, and
    the method further includes, after the removing the mold member, dissolving the adhesive agent in water or an aqueous solution to remove the adhesive agent.

10. The method of manufacturing a light emitting device according to claim 8, wherein the placing the mold member includes:
    providing an adhesive agent between the mold member and the wavelength conversion layer such that the mold member is made to temporarily adhere to the wavelength conversion layer,
    temporarily detaching the mold member from the wavelength conversion layer, and
    temporarily adhering the mold member to the wavelength conversion layer again.

11. A method of manufacturing a light emitting device, the method comprising:
    disposing a light emitting element on a substrate;
    disposing a wavelength conversion layer on the light emitting element;
    placing a mold member on the wavelength conversion layer, wherein a mold release agent is provided on a surface of the mold member;
    providing a light reflecting material that is uncured so as to surround the wavelength conversion layer and the mold member such that a top surface of the light reflecting material after being cured protrudes toward a direction from the substrate to the top surface of the light reflecting material or is parallel to a top surface of the substrate;
    forming a wall by curing the light reflecting material; and
    removing the mold member to form a hollow opening portion in the wall, the hollow opening portion exposing at least a part of a top surface of the wavelength conversion layer.

12. The method of manufacturing the light emitting device according to claim 11, wherein the mold member is formed of a light transmissive material.

13. The method of manufacturing the light emitting device according to claim 11, wherein the mold member is a plate like member.

14. The method of manufacturing the light emitting device according to claim 11,
    wherein the disposing the wavelength conversion layer includes:
    spraying a slurry material containing polysilazane and a plurality of wavelength conversion particles onto the light emitting element, and
    converting the polysilazane into silica by heating or leaving, at room temperature, a base on which the slurry material is sprayed, to thereby cover each of the plurality of wavelength conversion particles with a glass layer containing the silica and form an air layer between the plurality of wavelength conversion particles.

15. The method of manufacturing the light emitting device according to claim 11, wherein
    the light reflecting material includes a first member and a second member,
    the providing the light reflecting material includes:
        providing the first member so as to surround the wavelength conversion layer, and providing the second member over the first member and surrounding the first member, and wherein a viscosity of the first member is higher than a viscosity of the second member.

16. The method of manufacturing the light emitting device according to claim 15, wherein the light reflecting material includes a third member, the providing the light reflecting material includes providing the third member over the second member and surrounding the second member, and wherein a viscosity of the third member is lower than the viscosity of the second member.

17. The method of manufacturing the light emitting device according to claim 11, wherein in the placing the mold member, an adhesive agent is provided between the mold member and the wavelength conversion layer such that the mold member is made to temporarily adhere to the wavelength conversion layer.

18. The method of manufacturing the light emitting device according to claim 17, wherein the adhesive agent is water soluble, and the method further includes, after the removing the mold member, dissolving the adhesive agent in water or an aqueous solution to remove the adhesive agent.

19. The method of manufacturing the light emitting device according to claim 17, wherein the placing the mold member includes:

providing an adhesive agent between the mold member and the wavelength conversion layer such that the mold member is made to temporarily adhere to the wavelength conversion layer, temporarily detaching the mold member from the wavelength conversion layer, and temporarily adhering the mold member to the wavelength conversion layer again.

* * * * *